(12) United States Patent
Wang et al.

(10) Patent No.: US 10,269,621 B2
(45) Date of Patent: Apr. 23, 2019

(54) CONTACT PLUGS AND METHODS FORMING SAME

(71) Applicant: Taiwan Semiconductor Manufacturing Company, Ltd., Hsinchu (TW)

(72) Inventors: Chao-Hsun Wang, Chung-Li (TW); Fu-Kai Yang, Hsinchu (TW); Mei-Yun Wang, Chu-Pei (TW); Kuo-Yi Chao, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 22 days.

(21) Appl. No.: 15/490,439

(22) Filed: Apr. 18, 2017

(65) Prior Publication Data
US 2018/0301371 A1     Oct. 18, 2018

(51) Int. Cl.
*H01L 21/768* (2006.01)
*H01L 29/66* (2006.01)
(Continued)

(52) U.S. Cl.
CPC .. *H01L 21/76816* (2013.01); *H01L 21/28088* (2013.01); *H01L 21/76805* (2013.01); *H01L 21/76843* (2013.01); *H01L 21/76846* (2013.01); *H01L 21/76889* (2013.01); *H01L 21/76895* (2013.01); *H01L 23/485* (2013.01); *H01L 23/535* (2013.01); *H01L 29/45* (2013.01); *H01L 29/4966* (2013.01); *H01L 29/66545* (2013.01); *H01L 29/66795* (2013.01); *H01L 29/7851* (2013.01); *H01L 23/53209* (2013.01);
(Continued)

(58) Field of Classification Search
CPC ......... H01L 21/76816; H01L 21/76843; H01L 21/76802; H01L 21/76877; H01L 23/528; H01L 29/66545; H01L 29/66795
See application file for complete search history.

(56) References Cited

U.S. PATENT DOCUMENTS 8,772,109 B2   7/2014   Colinge
8,785,285 B2   7/2014   Tsai et al.
(Continued)

FOREIGN PATENT DOCUMENTS

KR   20160059862 A   5/2016

*Primary Examiner* — Joseph C. Nicely
(74) *Attorney, Agent, or Firm* — Slater Matsil, LLP

(57) ABSTRACT

A method includes forming a transistor including forming a source/drain region on a side of a dummy gate stack, forming a first Inter-Layer Dielectric (ILD) covering the source/drain region, and replacing the dummy gate stack with a replacement gate stack. The method further includes forming a second ILD over the first ILD and the replacement gate stack, and forming a lower source/drain contact plug electrically coupling to the source/drain region. The lower source/drain contact plug penetrates through both the first ILD and the second ILD. A third ILD is formed over the second ILD. A gate contact plug is formed in the second ILD and the third ILD. An upper source/drain contact plug is formed overlapping and contacting the lower source/drain contact plug. The upper source/drain contact plug penetrates through the third ILD. The upper source/drain contact plug and the gate contact plug are formed of different materials.

20 Claims, 29 Drawing Sheets

(51) Int. Cl.
  *H01L 21/28* (2006.01)
  *H01L 29/78* (2006.01)
  *H01L 29/49* (2006.01)
  *H01L 29/45* (2006.01)
  *H01L 23/535* (2006.01)
  *H01L 23/485* (2006.01)
  *H01L 23/532* (2006.01)

(52) U.S. Cl.
  CPC .. *H01L 23/53238* (2013.01); *H01L 23/53252* (2013.01); *H01L 23/53266* (2013.01); *H01L 23/53295* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,711,607 B1* | 7/2017 | Yang | H01L 29/42392 |
| 9,786,764 B2 | 10/2017 | Park et al. | |
| 2012/0104471 A1 | 5/2012 | Chang et al. | |
| 2012/0299104 A1 | 11/2012 | Cai et al. | |
| 2012/0306023 A1 | 12/2012 | Ma et al. | |
| 2012/0313153 A1* | 12/2012 | Zhang | H01L 29/1054 257/288 |
| 2013/0153963 A1* | 6/2013 | Shealy | H01L 23/291 257/190 |
| 2014/0199837 A1* | 7/2014 | Hung | H01L 21/76816 438/675 |
| 2015/0072494 A1* | 3/2015 | Lin | H01L 29/66795 438/283 |
| 2015/0371928 A1 | 12/2015 | Chen et al. | |
| 2016/0049482 A1* | 2/2016 | Liu | H01L 21/283 257/288 |
| 2017/0033188 A1 | 2/2017 | Chen et al. | |
| 2018/0197970 A1* | 7/2018 | Pan | H01L 29/665 |

* cited by examiner

CONTACT PLUGS AND METHODS FORMING SAME

BACKGROUND

In the formation of transistors, metals were used for forming contact plugs and metal gates. Contact plugs are used for connecting to the source and drain regions and the gates of transistors.

In a conventional formation process for forming contact plugs, a first source/drain contact plug is formed in a first Inter-Layer Dielectric (ILD), and electrically connects to a source/drain region. A contact etch stop layer and a second ILD are then formed, and a gate contact opening is formed to extend into the second ILD, the contact etch stop layer, and the first ILD to expose the underlying metal gate. A source/drain contact opening is also formed to extend into the second ILD and the contact etch stop layer to expose the first source/drain contact plug. The gate contact opening and the source/drain contact opening are then filled with conductive materials to form a gate contact plug and a second source/drain contact plug. The resulting contact plugs formed in this process may suffer from voids formed therein, especially in the gate contact plug, which has a high aspect ratio.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
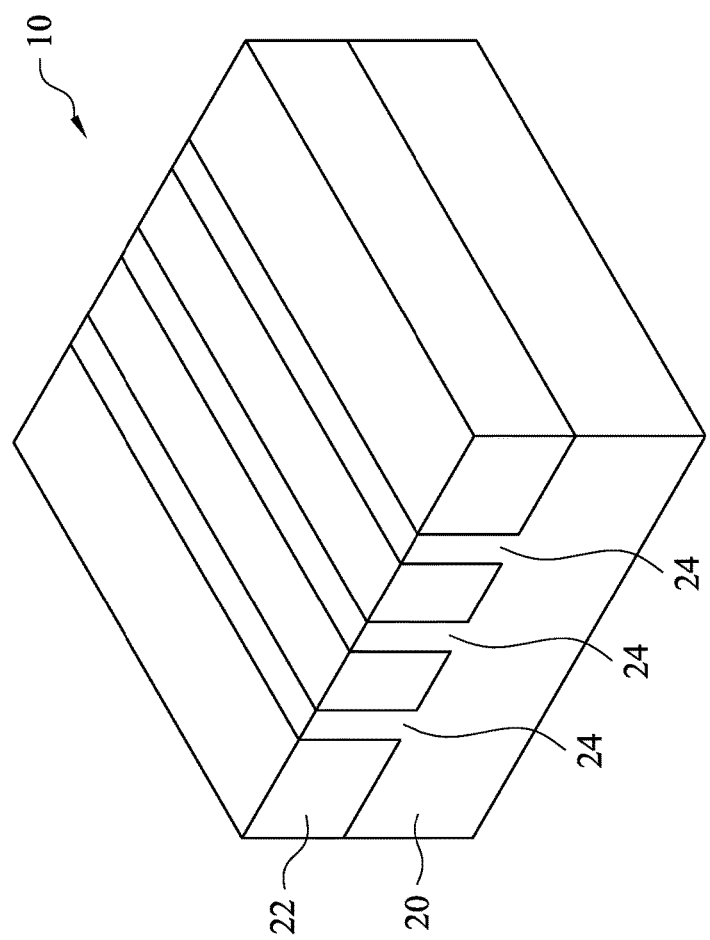
FIGS. 1 through 26 are perspective views and cross-sectional views of intermediate stages in the formation of a transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and the methods of forming the same are provided in accordance with various exemplary embodiments. The intermediate stages of forming the transistor are illustrated in accordance with some embodiments. Some variations of some embodiments are discussed. Throughout the various views and illustrative embodiments, like reference numbers are used to designate like elements. In the illustrated exemplary embodiments, the formation of a Fin Field-Effect Transistor (FinFET) is used as an example to explain the concept of the present disclosure. Planar transistors may also adopt the concept of the present disclosure.

FIGS. 1 through 26 illustrate the perspective views and cross-sectional views of intermediate stages in the formation of a FinFET in accordance with some embodiments of the present disclosure. The steps shown in FIGS. 1 through 26 are also reflected schematically in the process flow shown in FIG. 27.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
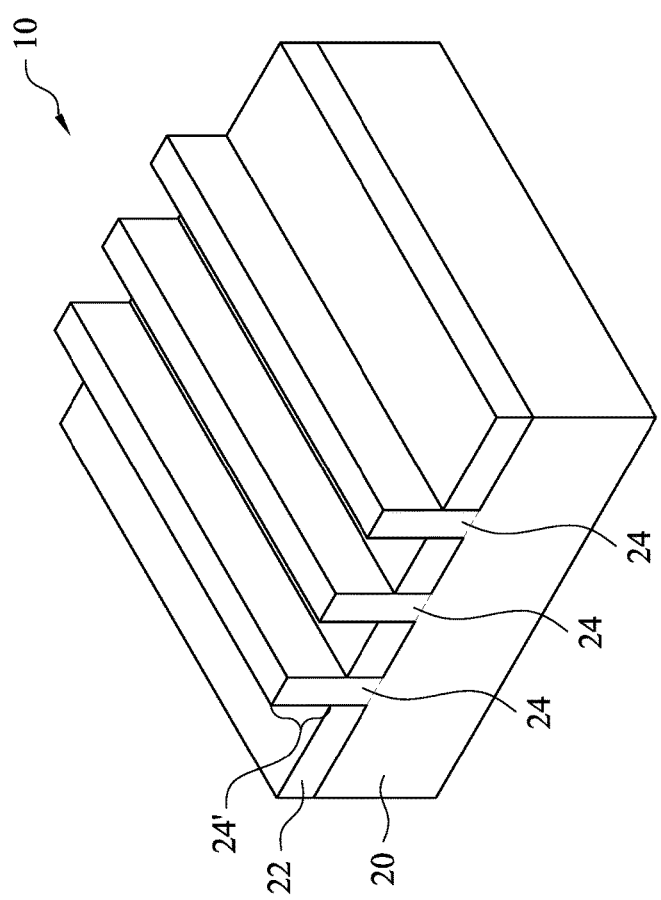

Referring to FIG. 2, STI regions 22 are recessed, so that the top portions of semiconductor strips 24 protrude higher than the top surfaces of STI regions 22 to form protruding fins 24'. The portions of semiconductor strips 24 in STI regions 22 are still referred to as semiconductor strips. The etching may be performed using a dry etching process, wherein $HF_3$ and $NH_3$ may be used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 3:
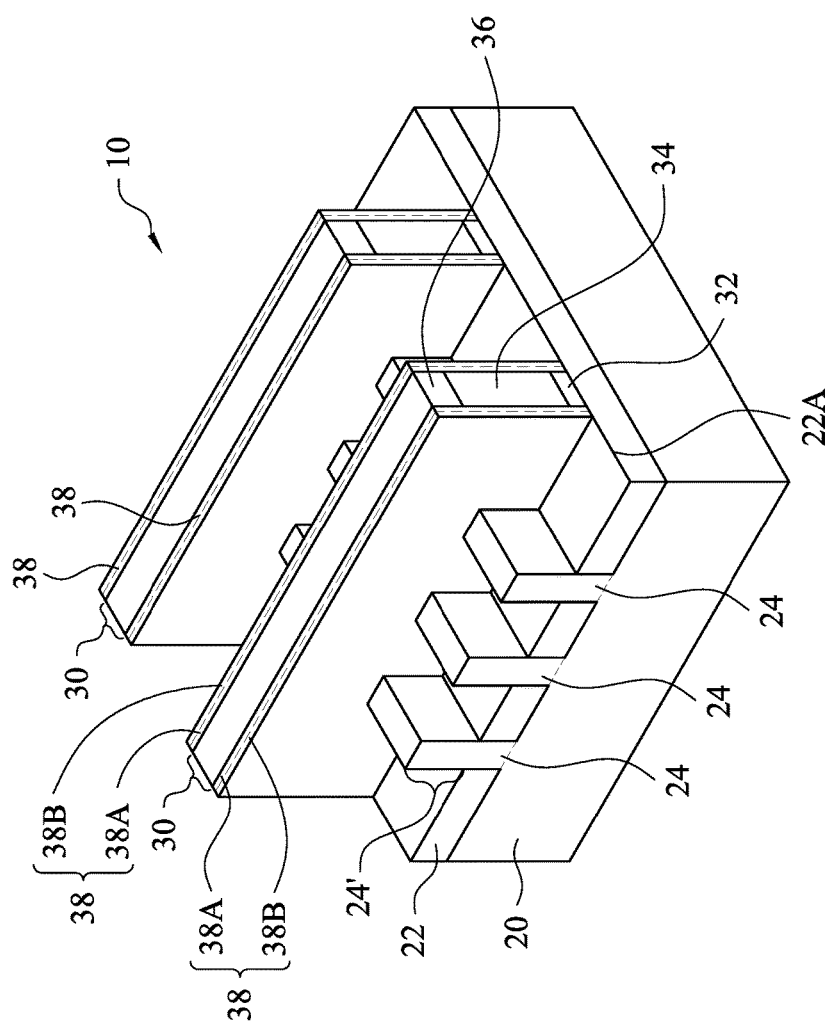

Referring to FIG. 3, dummy gate stacks 30 are formed on the top surfaces and the sidewalls of protruding fins 24'. It is appreciated that although two dummy gate stacks 30 are illustrated for clarity, there may be a single or more than two dummy gate stacks formed, which are parallel to each other, with the plurality of dummy gate stacks crossing the same semiconductor fin(s) 24'. Dummy gate stacks 30 may include dummy gate dielectrics 32 and dummy gate electrodes 34 over dummy gate dielectrics 32. Dummy gate electrodes 34 may be formed using, for example, polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have length-wise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of dielectric materials such as silicon carbon-oxynitride (SiCN), silicon nitride, or the like, and may have a single-layer structure or a multi-layer structure including a plurality of dielectric layers.

In accordance with some embodiments, each of gate spacers 38 includes a low-k dielectric layer 38A and a non-low-k dielectric layer 38B, with each of layers 38A and 38B formed through a blanket deposition step followed by an anisotropic etching step. Low-k dielectric layer 38A may be formed of a low-k dielectric material having a dielectric constant (k value) lower than about 3.5, which may be formed of SiON or SiOCN, with pores formed therein in order to reduce its k value to a desired low-k value. Non-low-k dielectric layer 38B may be formed of silicon nitride, for example.

Figure 4:
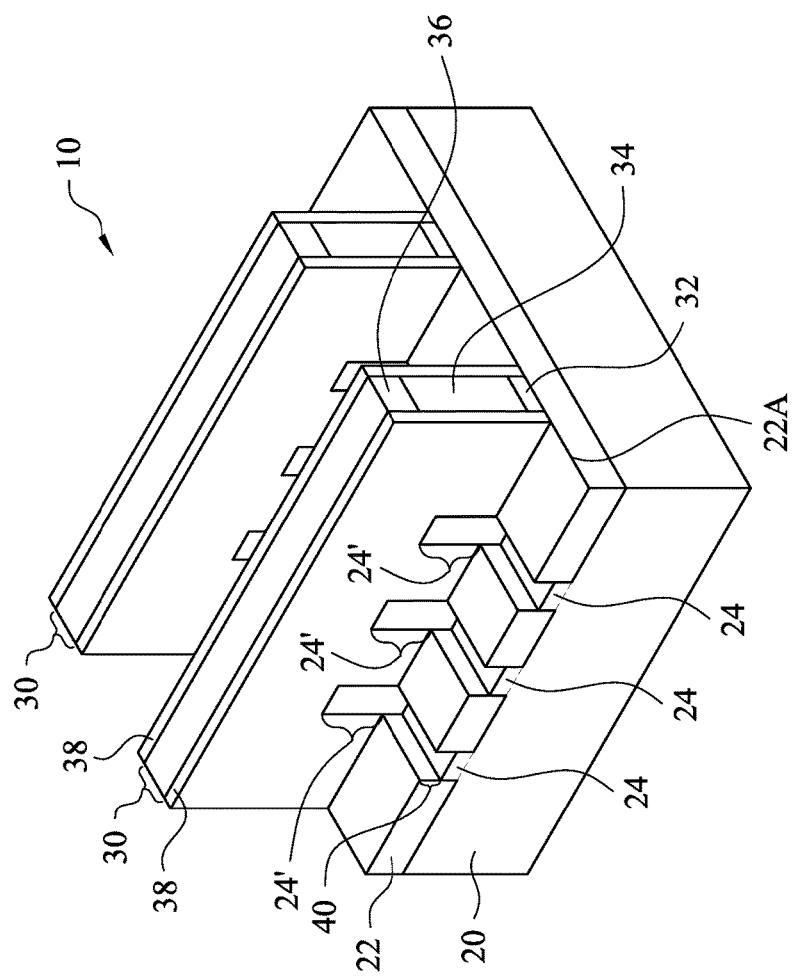

An etching step (referred to as source/drain recessing hereinafter) is then performed to etch the portions of protruding fins 24' that are not covered by dummy gate stacks 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stacks 30.

Figure 5A:
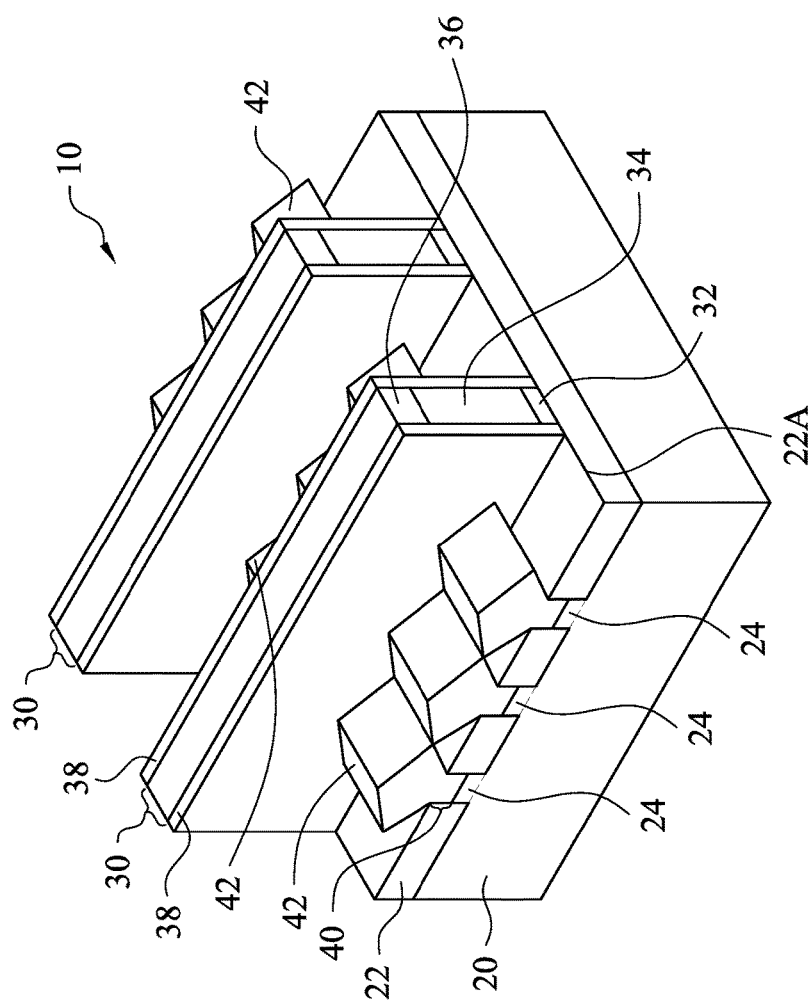

Next, source/drain regions are formed by selectively growing a semiconductor material in recesses 40 in an epitaxy, resulting in the structure in FIG. 5A. In accordance with some exemplary embodiments, source/drain regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, source/drain regions 42 are formed of a III-V compound semiconductor such as GaAs, InP, GaN, InGaAs, InAlAs, GaSb, AlSb, AlAs, AlP, GaP, combinations thereof, or multi-layers thereof. After source/drain regions 42 fully fill recesses 40, source/drain regions 42 start expanding horizontally, and facets may be formed.

After the epitaxy step, source/drain regions 42 may be further implanted with a p-type or an n-type impurity to increases their impurity concentration. In accordance with alternative embodiments of the present disclosure, the implantation step is skipped when source/drain regions 42 are in-situ doped with the p-type or n-type impurity during the epitaxy. Source/drain regions 42 may include lower portions that are formed in STI regions 22, and upper portions that are formed over the top surfaces 22A of STI regions 22.

Figure 5B:
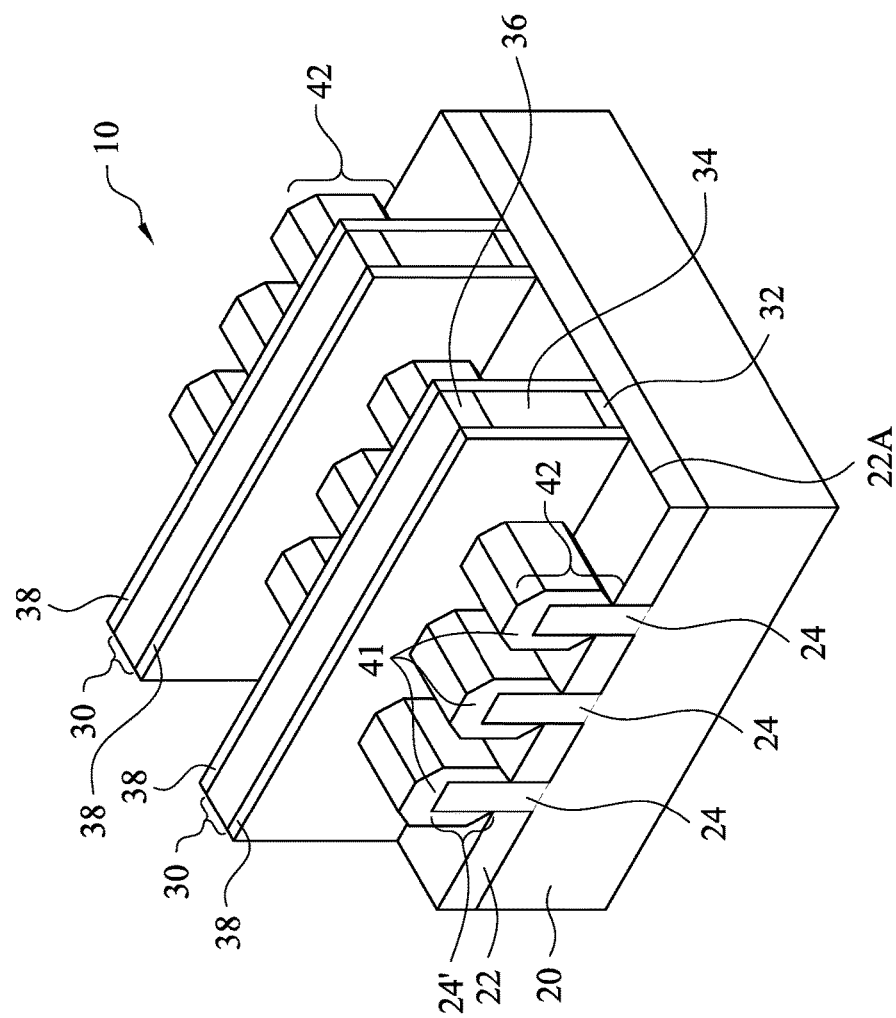

FIG. 5B illustrates the formation of source/drain regions 42 in accordance with alternative embodiments, wherein protruding fins 24' are not recessed, and epitaxy regions 41 are epitaxially grown on the exposed protruding fins 24'. Accordingly, the source/drain regions (which are also referred to using reference numeral 42) include epitaxy regions 41 and the corresponding parts of protruding fins 24', both may be implanted to increase their impurity concentration.

Figure 6A:
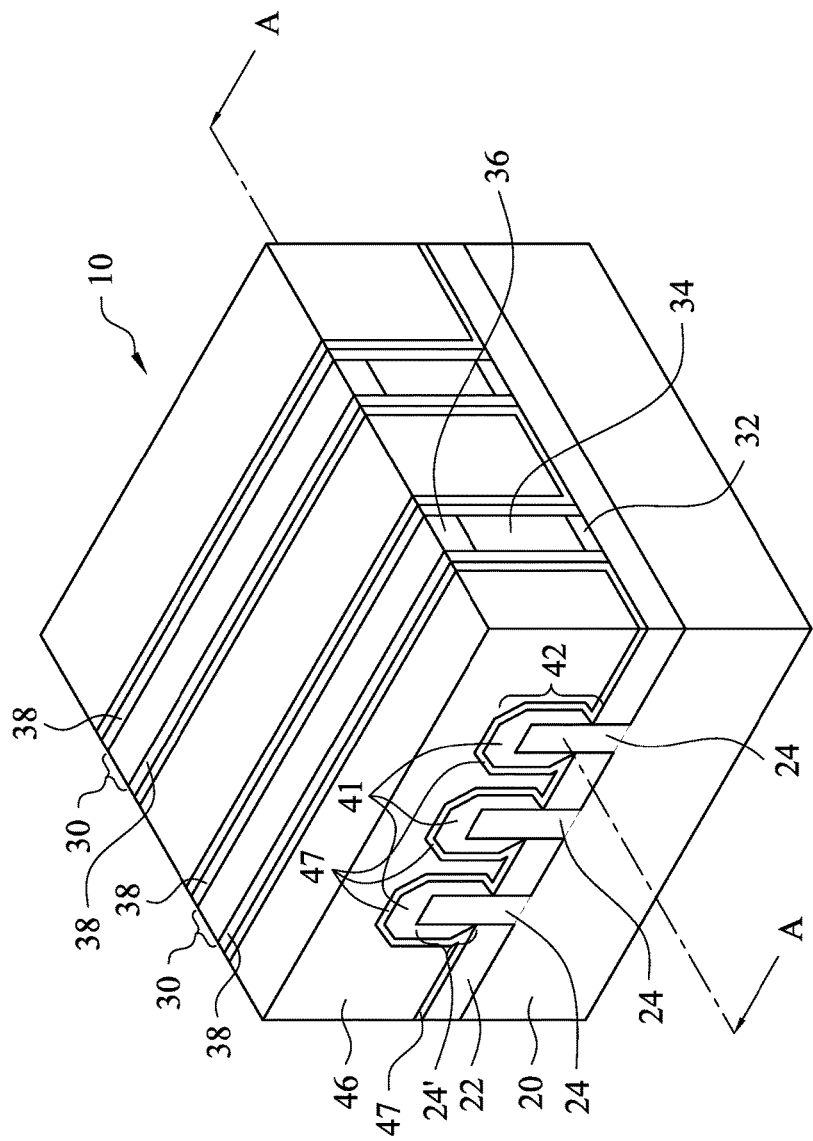

FIG. 6A illustrates a perspective view of the structure with Contact Etch Stop Layer (CESL) 47 and Inter-Layer Dielectric (ILD) 46 being formed. In accordance with some embodiments of the present disclosure, a buffer oxide layer (not shown) and CESL 47 are formed on source and drain regions 42. The buffer oxide layer may be formed of silicon oxide, and the CESL 47 may be formed of silicon nitride, silicon carbo-nitride, or the like. The buffer oxide layer and CESL 47 may be formed using a conformal deposition method such as ALD, for example. ILD 46 may include a dielectric material formed using, for example, FCVD, spin-on coating, CVD, or another applicable deposition method. ILD 46 may be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of ILD 46, CESL 47, dummy gate stacks 30, and gate spacers 38 with each other.

Figure 6B:
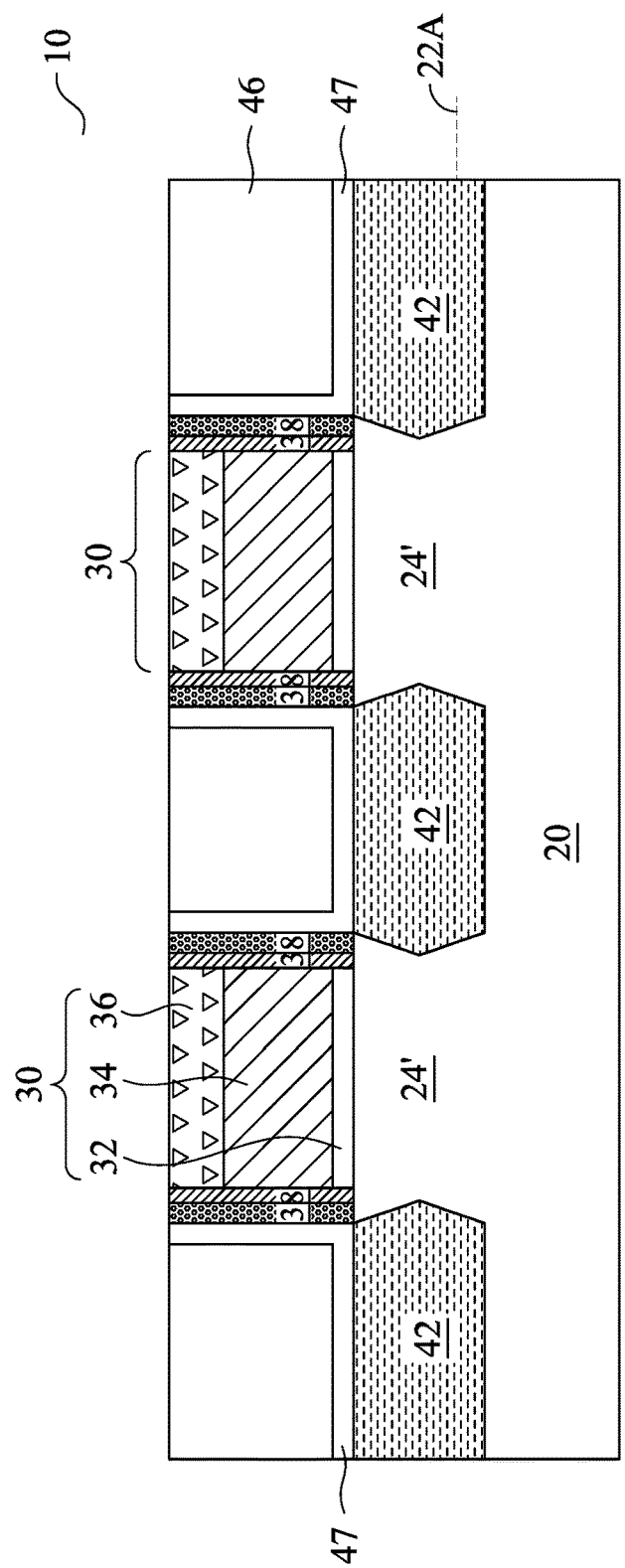

A cross-sectional view of the structure shown in FIG. 6A is illustrated in FIG. 6B, wherein the cross-sectional view is obtained from a vertical plane containing line A-A in FIG. 6A. In the cross-sectional view, two of the plurality of dummy gate stacks 30 are illustrated, and source/drain regions 42 formed between neighboring dummy gate stacks 30 are illustrated. It is appreciated that more dummy gate stacks 30 and source/drain regions 42 may be formed. Also, the top surfaces of source/drain regions 42 may be higher than the bottom surfaces of dummy gate stacks 30 in accordance with some embodiments.

Next, dummy gate stacks 30 are replaced with replacement gate stacks, which include metal gates and replacement gate dielectrics, as shown in FIGS. 7 through 10. The cross-sectional views shown in FIGS. 7 through 10 and the subsequent FIGS. 11 through 26 are obtained from the same vertical plane containing line A-A in FIG. 6A. In FIGS. 7 through 26, the level 22A of the top surfaces of STI regions 22 are illustrated, and semiconductor fins 24' are over level 22A.

Figure 7:
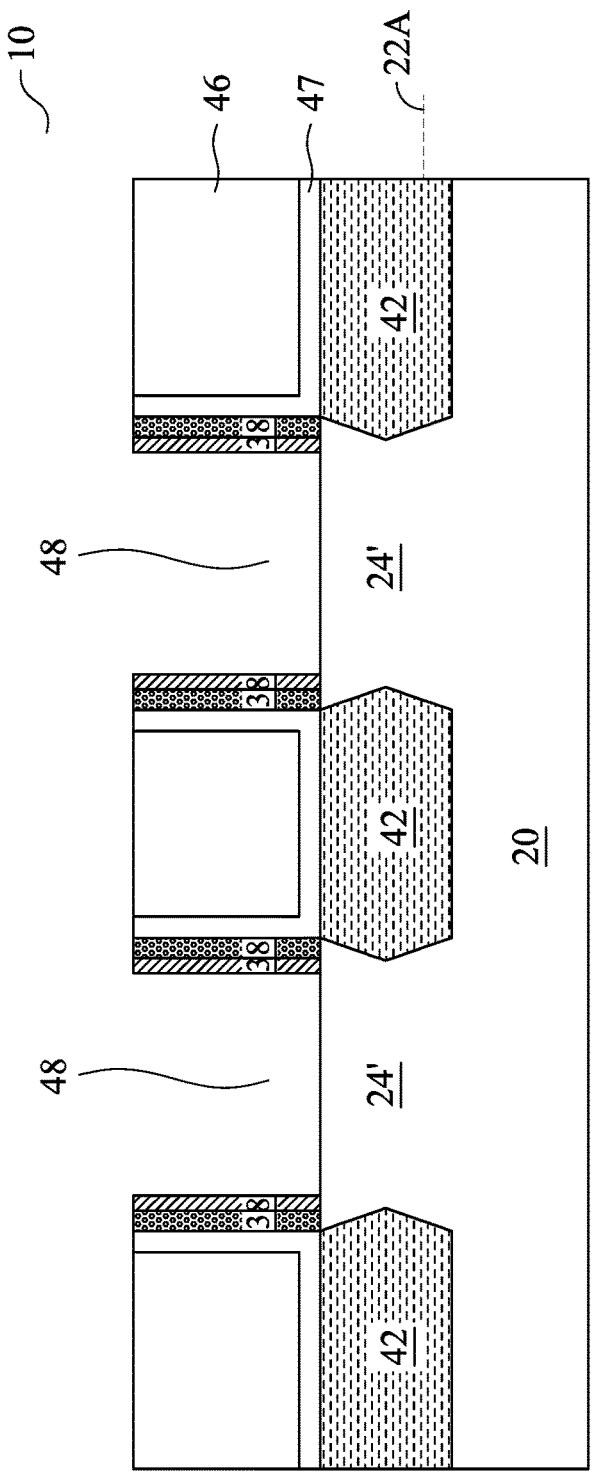

When replacing gate stacks, hard mask layers 36, dummy gate electrodes 34, and dummy gate dielectrics 32 as shown in FIGS. 6A and 6B are first removed in one or a plurality of etching steps, resulting in trenches/openings 48 as shown in FIG. 7. The respective step is illustrated as step 202 in the process flow shown in FIG. 27. The top surfaces and the sidewalls (not in the illustrated plane) of protruding semiconductor fins 24' are exposed to trenches 48.

Figure 8:
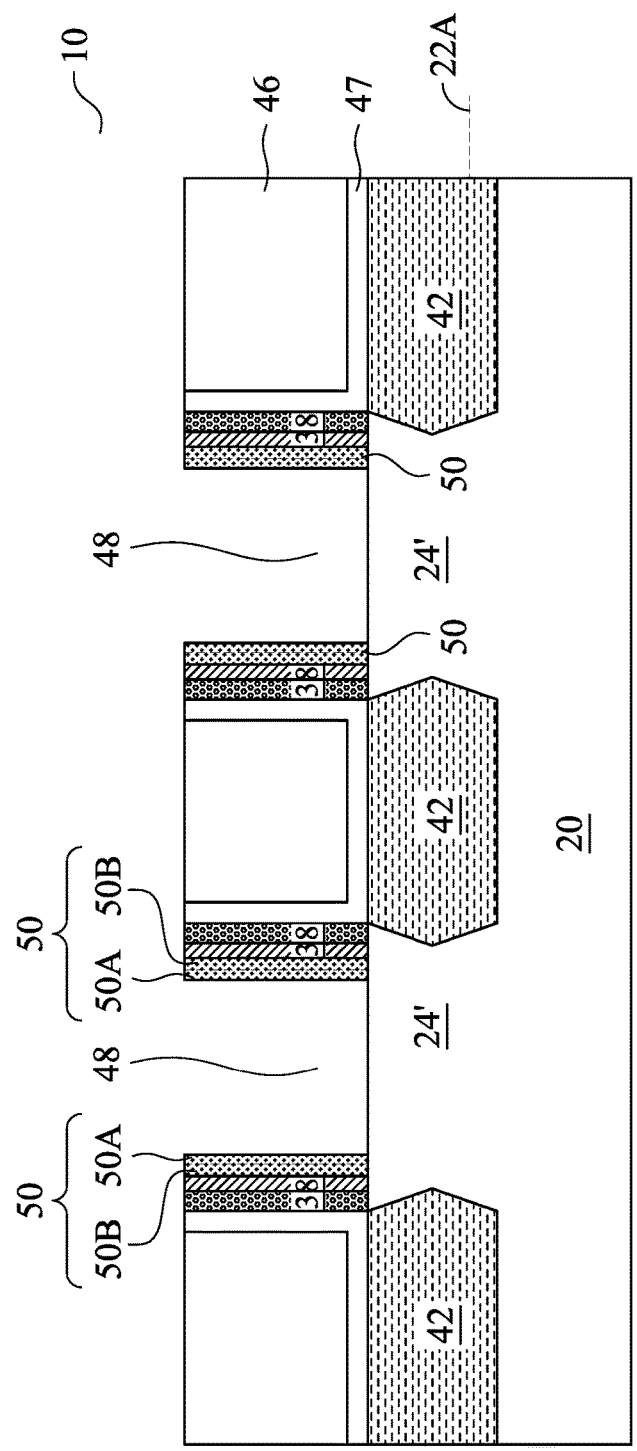

FIG. 8 illustrates the formation of gate spacers 50 in accordance with some embodiments. The respective step is illustrated as step 204 in the process flow shown in FIG. 27. In accordance with alternative embodiments, gate spacers 50 are not formed. To form gate spacers 50, one or more blanket gate spacer layers is formed, for example, using a deposition method such as ALD or CVD. The blanket gate spacer layers are conformal. In accordance with some embodiments of the present disclosure, the gate spacer layers are formed of silicon nitride (SiN), SiC, SiON, Silicon oxy-carbo nitride, or other dielectric materials. The blanket gate spacer layers are etched in anisotropic etching to remove horizontal portions, and the remaining vertical portions form gate spacers 50. Gate spacers 50 separate the subsequently formed metal gates farther away from source/drain regions 42, so that the possibility of leakage and electrical shorting between them are reduced.

In accordance with some embodiments, gate spacers 50 are formed of a low-k dielectric material, which may have a dielectric constant (k value) lower than about 3.5 or 3.0. Throughout the description, the k value of silicon oxide ($SiO_2$), which is about 3.9, is used to distinguish low k values from high k values. Accordingly, the k values lower than 3.8 are referred to as low k values, and the respective dielectric materials are referred to as low-k dielectric materials. Conversely, the k values higher than 3.9 are referred to as high k values, and the respective dielectric materials are referred to as high-k dielectric materials. For example, gate spacers 50 may be formed of SiON or SiOCN, which are formed as being porous in order to have the desired low-k value. The formation of the low-k dielectric spacers 50 advantageously reduces the parasitic capacitance between the subsequently formed metal gates and source/drain regions 42.

Each of gate spacer 50 may be formed of a single layer having a homogenous dielectric material, or a plurality of dielectric layers formed of different dielectric materials. For example, gate spacer 50 may include sub-spacer 50A formed of a low-k dielectric material, and sub-spacer 50B formed of silicon oxide or a high-k dielectric material. The formation process may include depositing a conformal dielectric layer and performing an anisotropic etch to form sub-spacer 50A, and then depositing another conformal dielectric layer and performing another anisotropic etch to form sub-spacer 50B.

Figure 9:
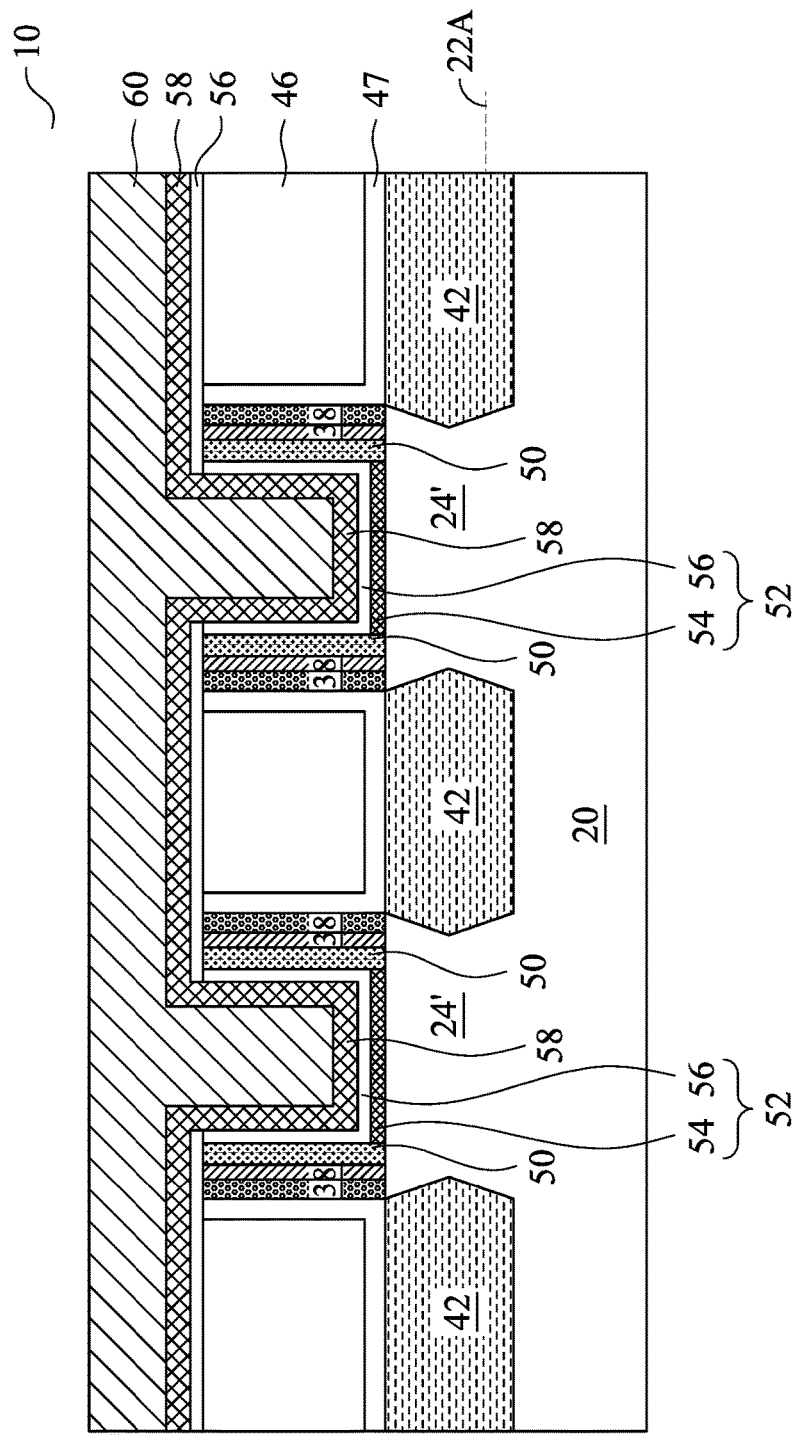

Next, referring to FIG. 9, (replacement) gate dielectric layer 52 is formed, which extend into trenches 48 (FIG. 8). The respective step is illustrated as step 206 in the process flow shown in FIG. 27. In accordance with some embodiments of the present disclosure, gate dielectric layer 52 includes Interfacial Layer (IL) 54 as its lower part. IL 54 is formed on the exposed surfaces of protruding fins 24'. IL 54 may include an oxide layer such as a silicon oxide layer, which may be formed through the thermal oxidation of protruding fins 24', a chemical oxidation process, or a deposition process. Gate dielectric layer 52 may also include high-k dielectric layer 56 formed over IL 54. High-k dielectric layer 56 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. High-k dielectric layer 56 is overlying, and may contact, IL 54. High-k dielectric layer 56 is formed as a conformal layer, and extends on the sidewalls of protruding fins 24' and the top surfaces and the sidewalls of gate spacers 38/50. In accordance with some embodiments of the present disclosure, high-k dielectric layer 56 is formed using ALD or CVD.

Referring further to FIG. 9, stacked layers 58 are deposited. The respective step is illustrated as step 208 in the process flow shown in FIG. 27. The sub-layers in stacked layers 58 are not shown separately, while the sub-layers may be distinguishable from each other. The deposition may be performed using a conformal deposition method such as ALD or CVD, so that the thickness of the vertical portions and the thickness of the horizontal portions of stacked layers 58 (and each of sub-layers) are substantially equal to each other. Stacked layers 58 extend into trenches 48 (FIG. 8), and include some portions over ILD 46.

Stacked layers 58 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), another barrier layer, which may be another TiN layer, is formed.

Figure 10:
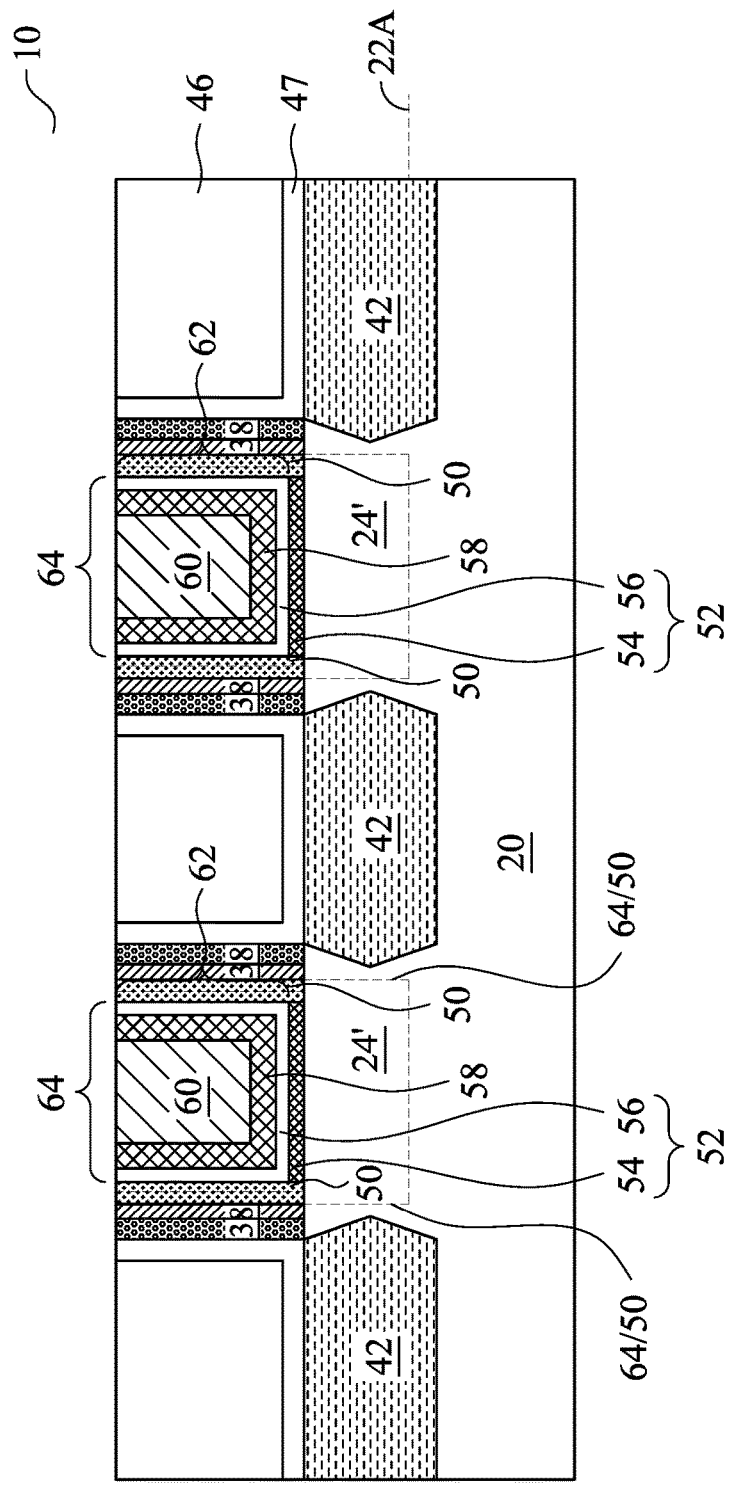

Next, metallic material 60 is deposited, which may be formed of tungsten or cobalt, for example. Metallic material 60 fully fills remaining trenches 48 (FIG. 8). In a subsequent step as shown in FIG. 10, a planarization step such as CMP or mechanical grinding is performed, so that the portions of layers 56, 58, and 60 over ILD 46 are removed. The respective step is illustrated as step 210 in the process flow shown in FIG. 27. As a result, metal gate electrodes 62 are formed, which include the remaining portions of layers 58 and 60. The remaining portion of layers 52, 58, and 60 are referred to as replacement gate stacks 64 hereinafter. As shown in FIG. 10, the top surfaces of metal gate 62, spacers 38/50, CESL 47, and ILD 46 may be substantially coplanar at this time.

In accordance with alternative embodiments, gate stacks 64 are recessed to form recesses between opposite portions of gate spacers 38/50, and dielectric hard masks (such as silicon nitride, not shown) are filled into the recesses, followed by a planarization step so that the top surfaces of the dielectric hard masks, spacers 38/50, CESL 47, and ILD 46 are substantially coplanar at this time.

In FIG. 10, dashed lines (marked as 64/50) are illustrated as aligned to the outer edges of gate spacers 50 to show that gate spacers 50 and replacement gate stacks 64 extend below the illustrated top surfaces of semiconductor fins 24', and extend onto the sidewalls of semiconductor fins 24'. The dashed lines indicate that these portions of gate spacers 50 and replacement gate stacks 64 are not in the illustrated plane. Also, although not shown, gate spacers 38 also extend onto the sidewalls of semiconductor fins 24', as shown in FIG. 3.

FIGS. 11 through 26 illustrate the formation of source/drain contact plugs and gate contact plugs. In the illustrated example, three source/drain regions 42 are shown, and the illustrated process shows the formation of the source/drain contact plug connected to the leftmost source/drain region 42. In an actual process, there may also be source/drain contact plugs formed to connect to the center and the rightmost source/drain regions 42. These source/drain contact plugs, however, are formed in different planes than illustrated, and hence are not visible. Similarly, although a single gate contact plug is illustrated as directly over the right gate stack 64, there may also be a gate contact plug formed directly over and connect to the left gate stack 64, which is in a different plane than illustrated, and hence is not shown.

Figure 11:
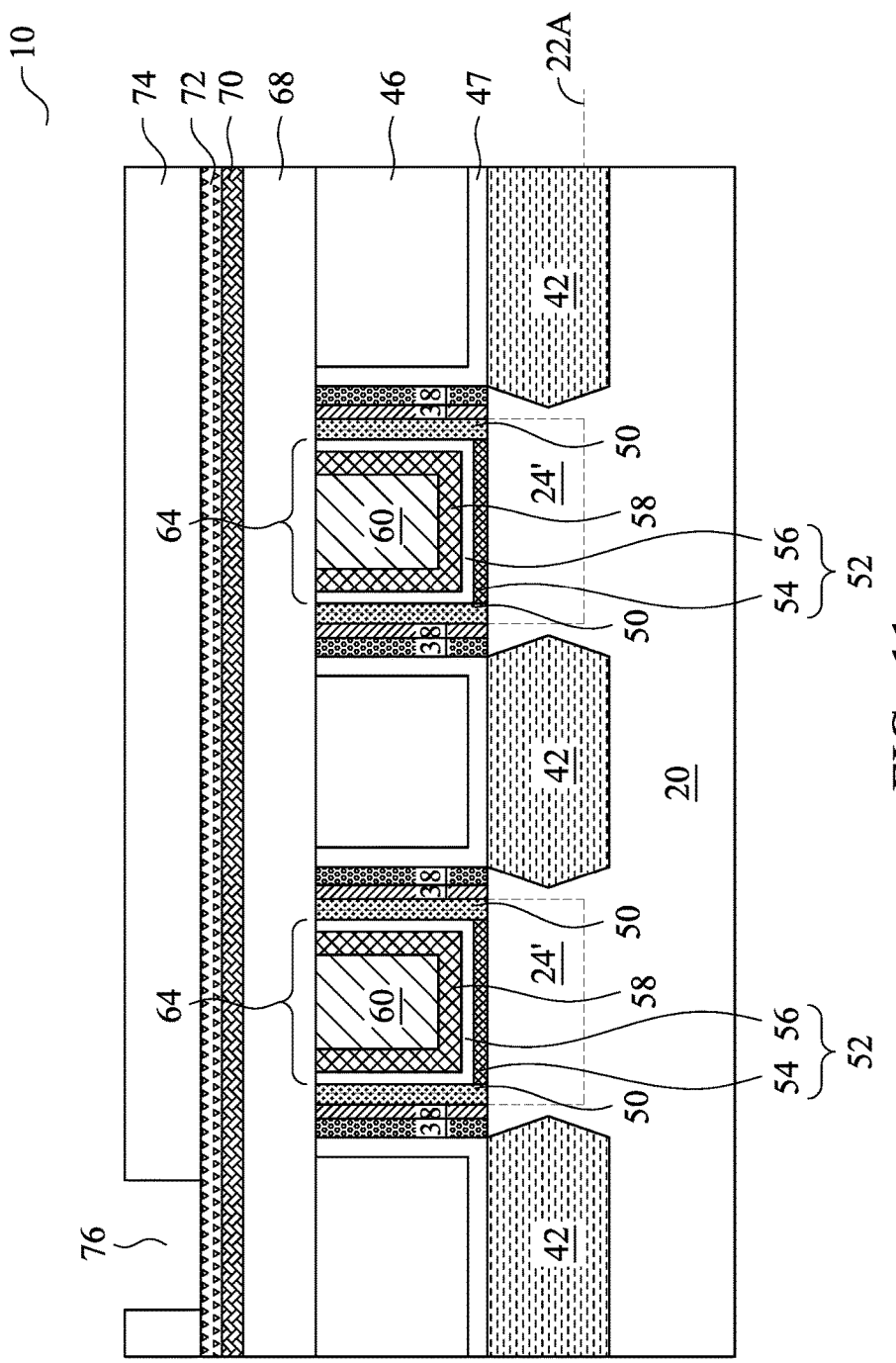

Referring to FIG. 11, ILD 68 is formed over gate stack 64 and ILD 46. The material of ILD 68 may be selected from the same candidate materials (and methods) for forming ILD 46, and ILDs 46 and 68 may be formed of the same or different dielectric materials. For example, dielectric layer 68 may be formed using PECVD, and may include silicon oxide ($SiO_2$). There may be, or may not be, distinguishable interface between ILDs 46 and 68. The thickness of dielectric layer 68 may be in the range between about 700 Å and about 800 Å.

Metal hard mask 70, which is used as an etching mask in subsequent etching, is then formed over ILD 68. Metal hard mask 70 may be formed of a metal nitride such as titanium nitride. Pad oxide layer 72, which may be formed of silicon oxide, is then formed over hard mask layer 70. Photo resist 74 is then applied and patterned, forming opening 76.

Figure 12:
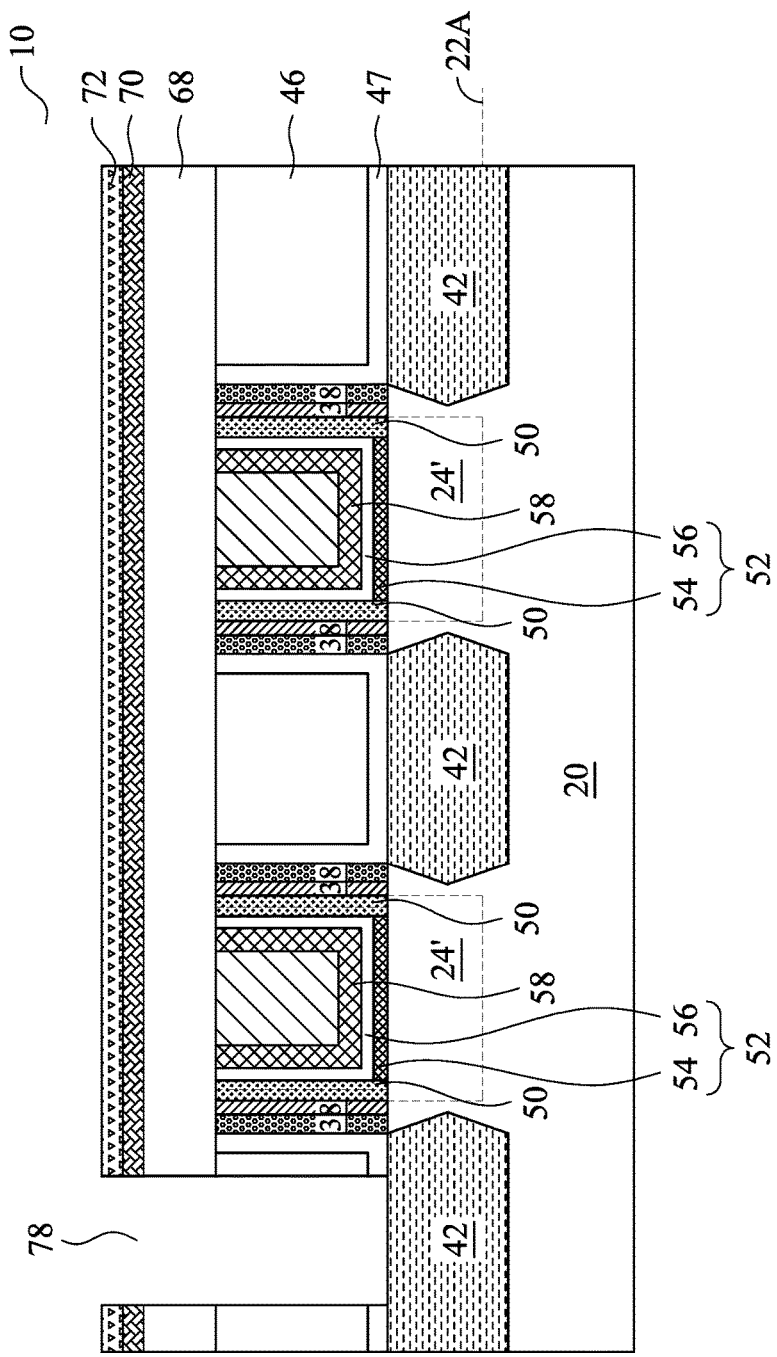

The patterned photo resist 74 is then used to etch the underlying pad oxide layer 72 and metal hard mask 70, so that opening 76 extends into metal hard mask 70. Next, photo resist 74 is removed, for example, in an ashing process. The remaining pad oxide layer 72 and metal hard mask 70 are then used as an etching mask to etch ILD 68, ILD 46, and CESL 47, so that source/drain contact opening 78 is formed, as shown in FIG. 12. The respective step is illustrated as step 212 in the process flow shown in FIG. 27. CESL 47 is used as an etch stop layer in the etching of layers 68 and 46, and then CESL 47 is etched, exposing the underlying source/drain region 42.

Figure 13:
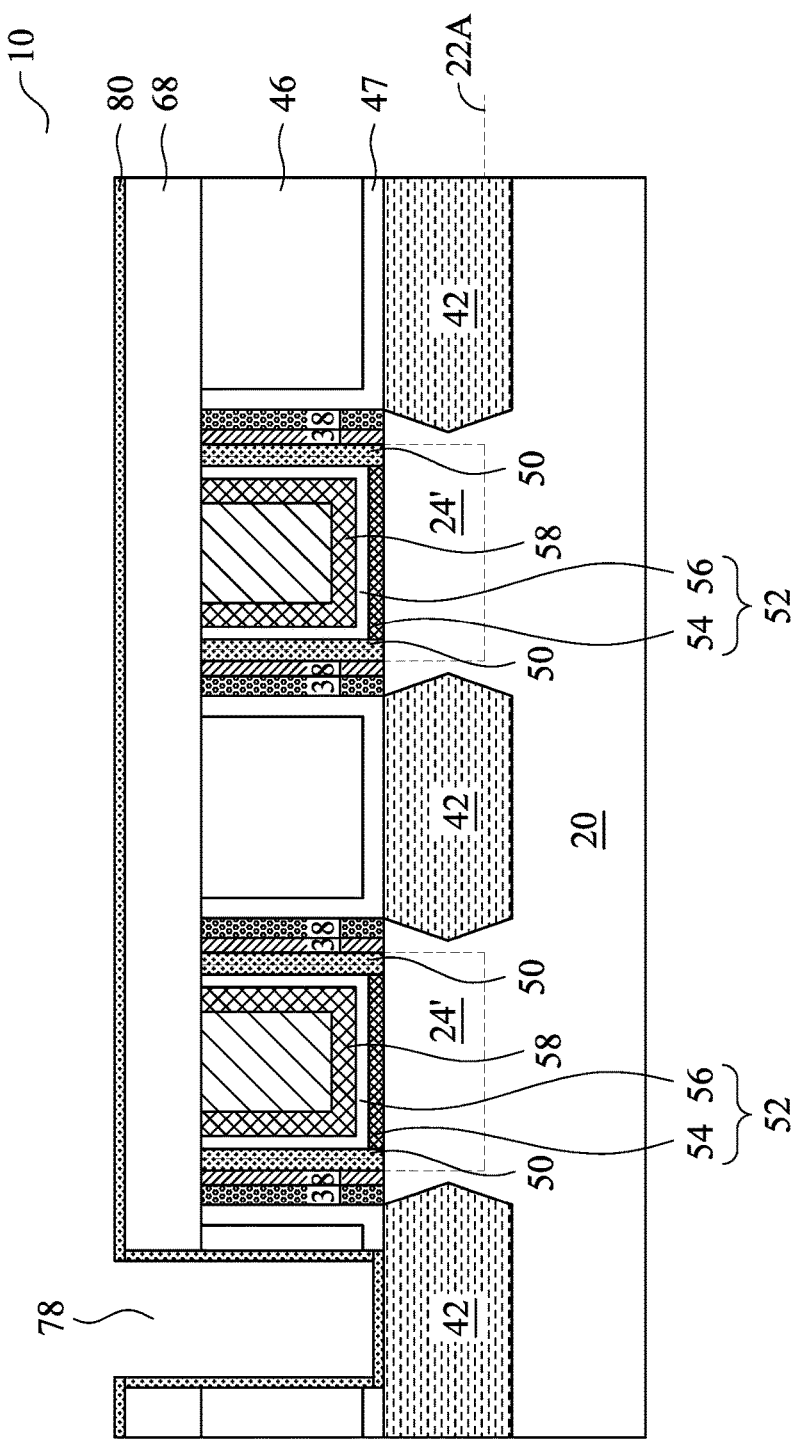

Referring to FIG. 13, dielectric layer 80 is formed, for example, using a conformal deposition method such as CVD or ALD. Dielectric layer 80 may be a high-k dielectric layer with a k value greater than 3.9, so that it has good isolation ability. The candidate materials include $Al_xO_y$, $HfO_2$, SiN, and SiOCN (with no pores or substantially no pores inside). The thickness of dielectric layer 80 may be in the range between about 2 nm and about 4 nm.

Figure 14:
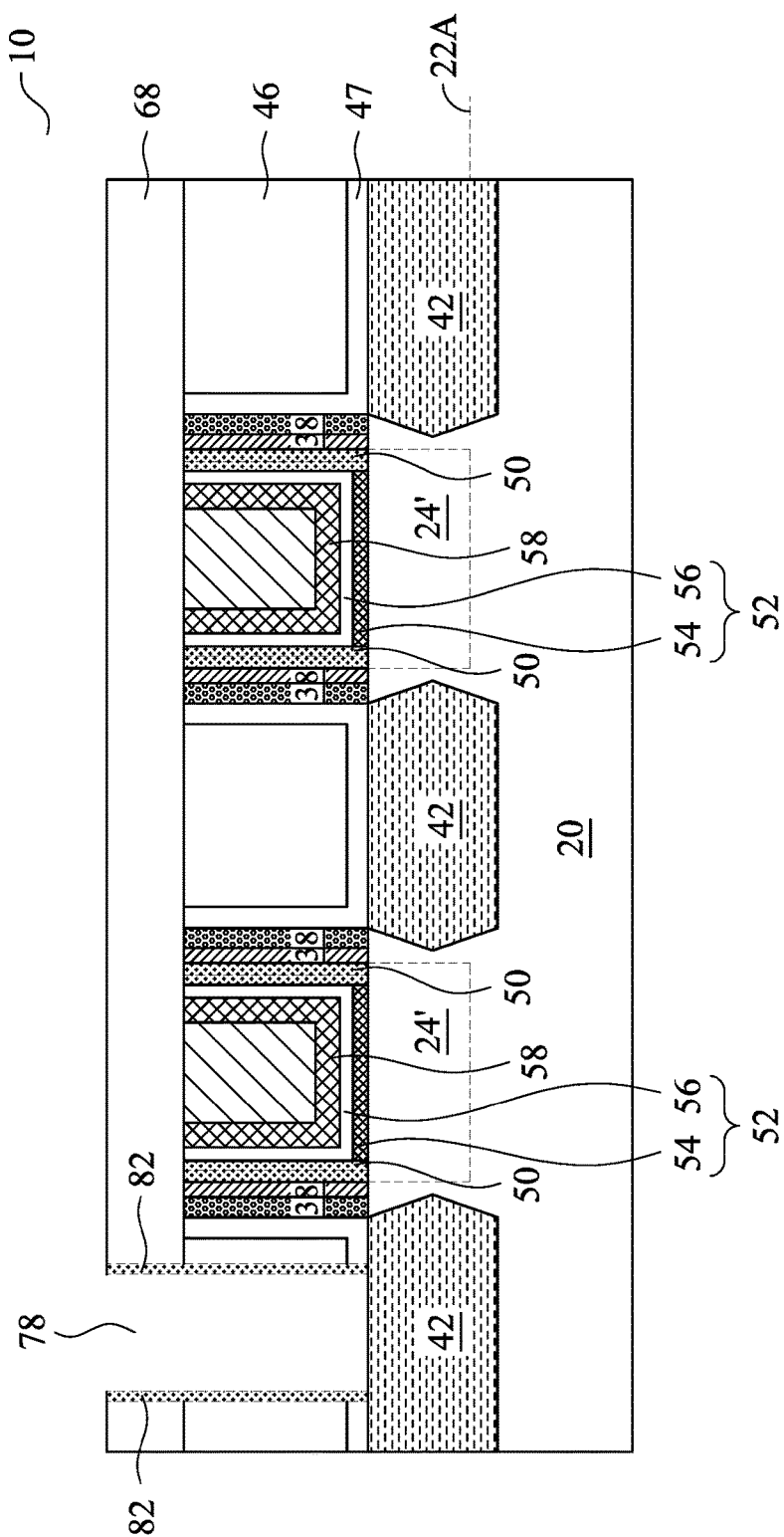

An anisotropic etch is then performed, so that the horizontal portions of dielectric layer 80 are removed, and the remaining vertical portions on the sidewalls of opening 78 form contact spacer 82, which forms a ring when viewed from the top of wafer 10. The resulting structure is shown in FIG. 14. The respective step is illustrated as step 214 in the process flow shown in FIG. 27. In accordance with alternative embodiments, the formation of contact spacer 82 is skipped.

Figure 15:
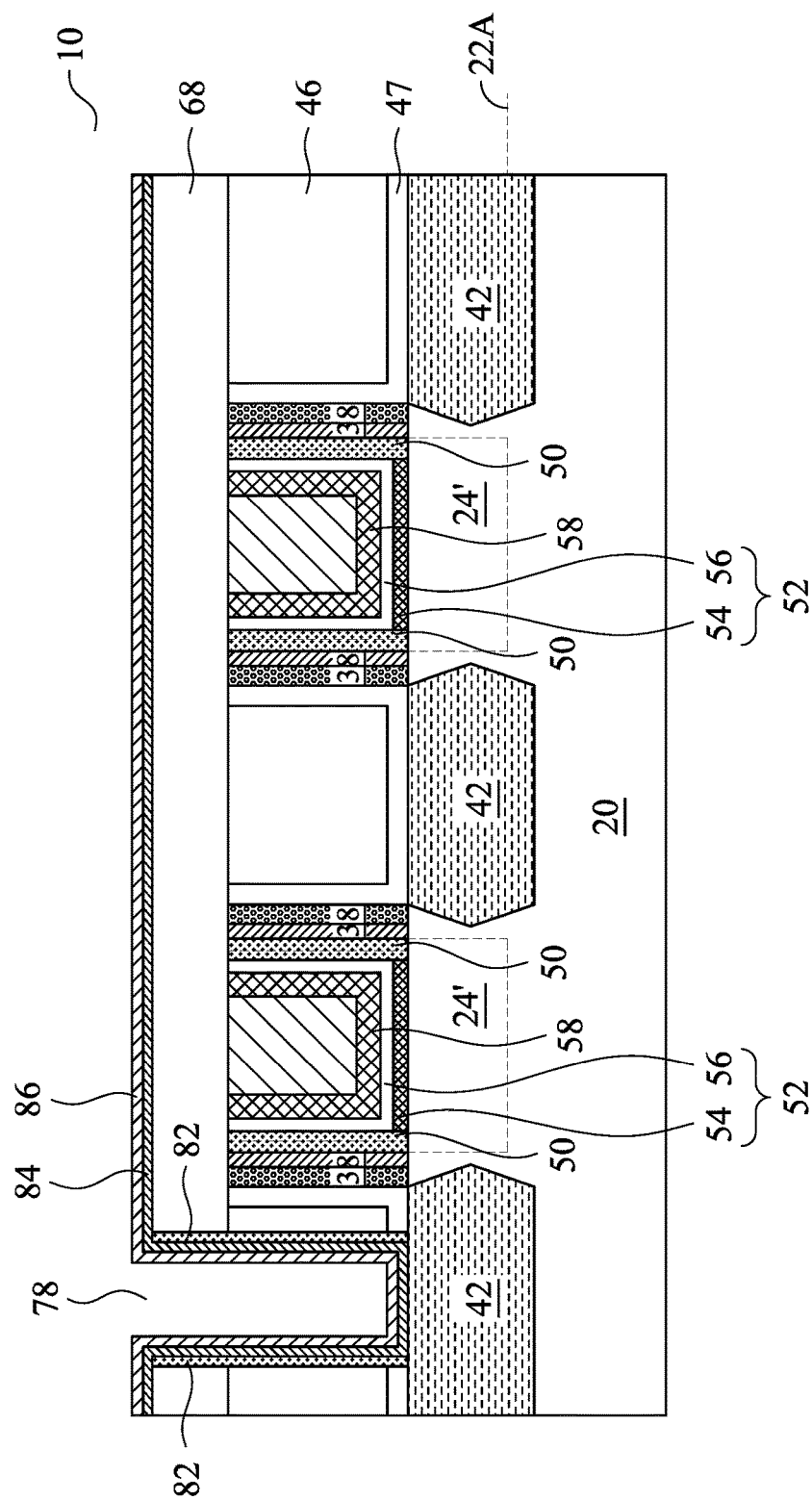

FIGS. 15 through 18 illustrate the formation of a lower source/drain contact plug. The respective step is illustrated as step 216 in the process flow shown in FIG. 27. Referring to FIG. 15, metal layer 84 (such as a titanium layer or a cobalt layer) is deposited, for example, using PVD. Barrier layer 86, which may be a metal nitride layer such as a titanium nitride layer or a tantalum nitride layer, is then formed over metal layer 84. Barrier layer 86 may be formed by nitridizing a top layer of metal layer 84, leaving the bottom layer of metal layer 84 not nitridized, or may be formed using a deposition method such as CVD. Layers 84 and 86 are both conformal, and extend into opening 78.

Figure 16:
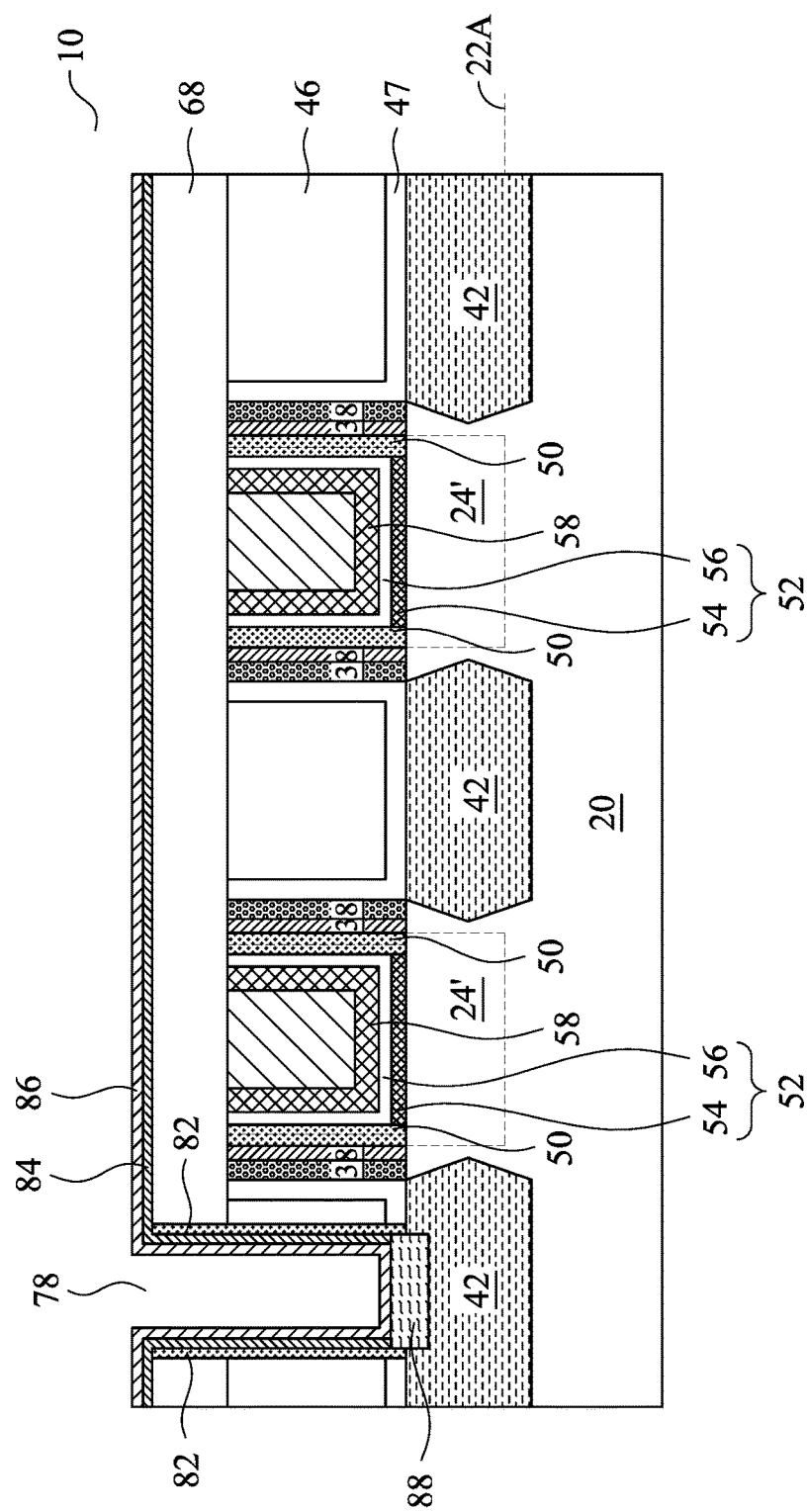

An anneal is then performed to form source/drain silicide region 88, as shown in FIG. 16. The anneal may be performed through Rapid Thermal Anneal (RTA), furnace anneal, or the like. Accordingly, the bottom portion of metal layer 84 reacts with source/drain region 42 to form silicide region 88. The sidewall portions of metal layer 84 remain after the silicidation process. In accordance with some embodiments of the present disclosure, the top surface of silicide region 88 is in contact with the bottom surface of barrier layer 86.

Figure 17:
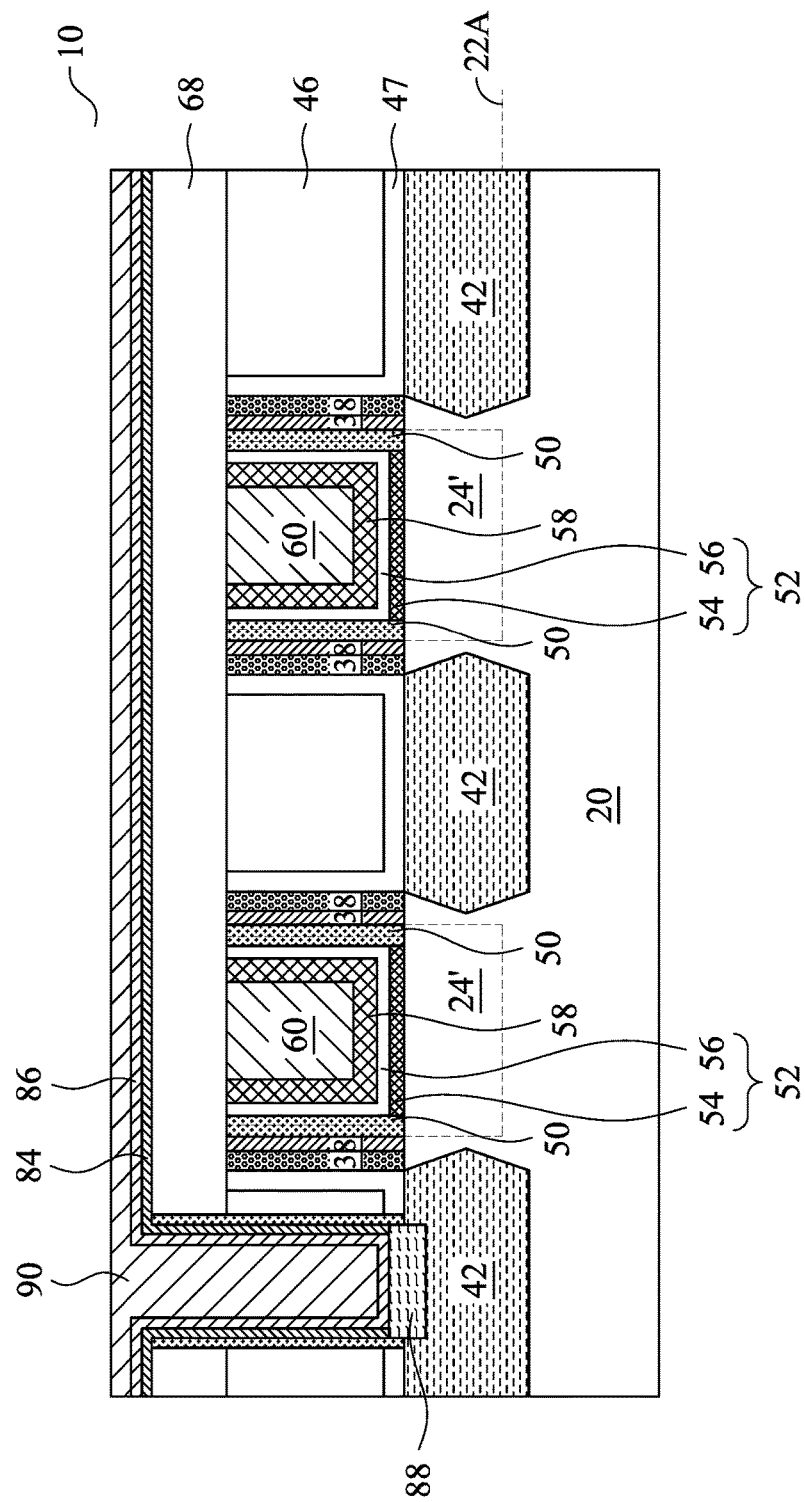
Figure 18:
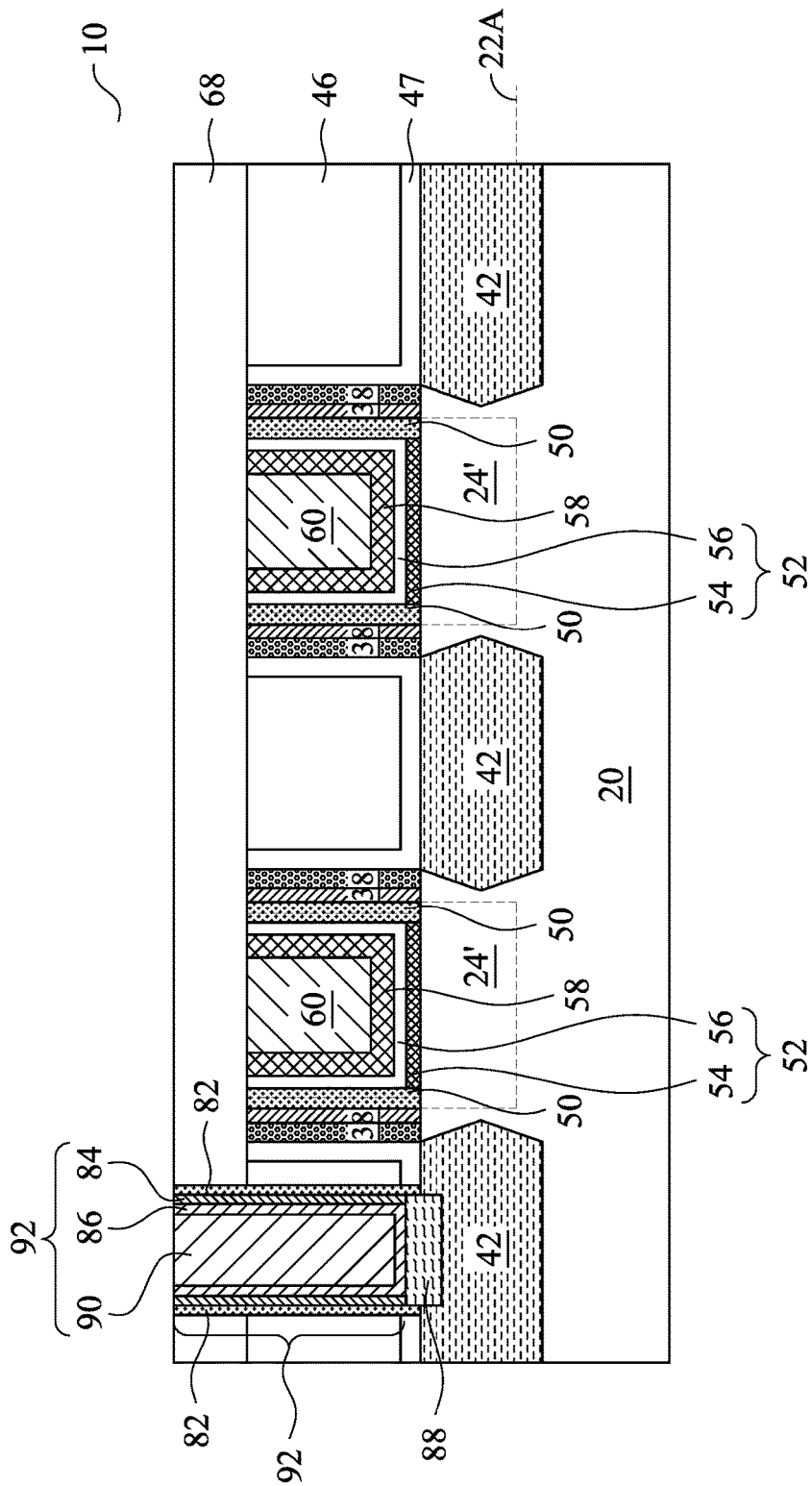

Next, as shown in FIG. 17, metallic material 90 is deposited over and in contact with barrier layer 86. Metallic material 90 may be selected from the same group of candidate materials of metal-containing material 60, and may include tungsten or cobalt. A planarization step such as CMP or mechanical grinding is then performed to remove the portions of layers 84, 86, and 90 over ILD 68. The resulting structure is shown in FIG. 18, which includes source/drain contact plug 92.

Figure 19:
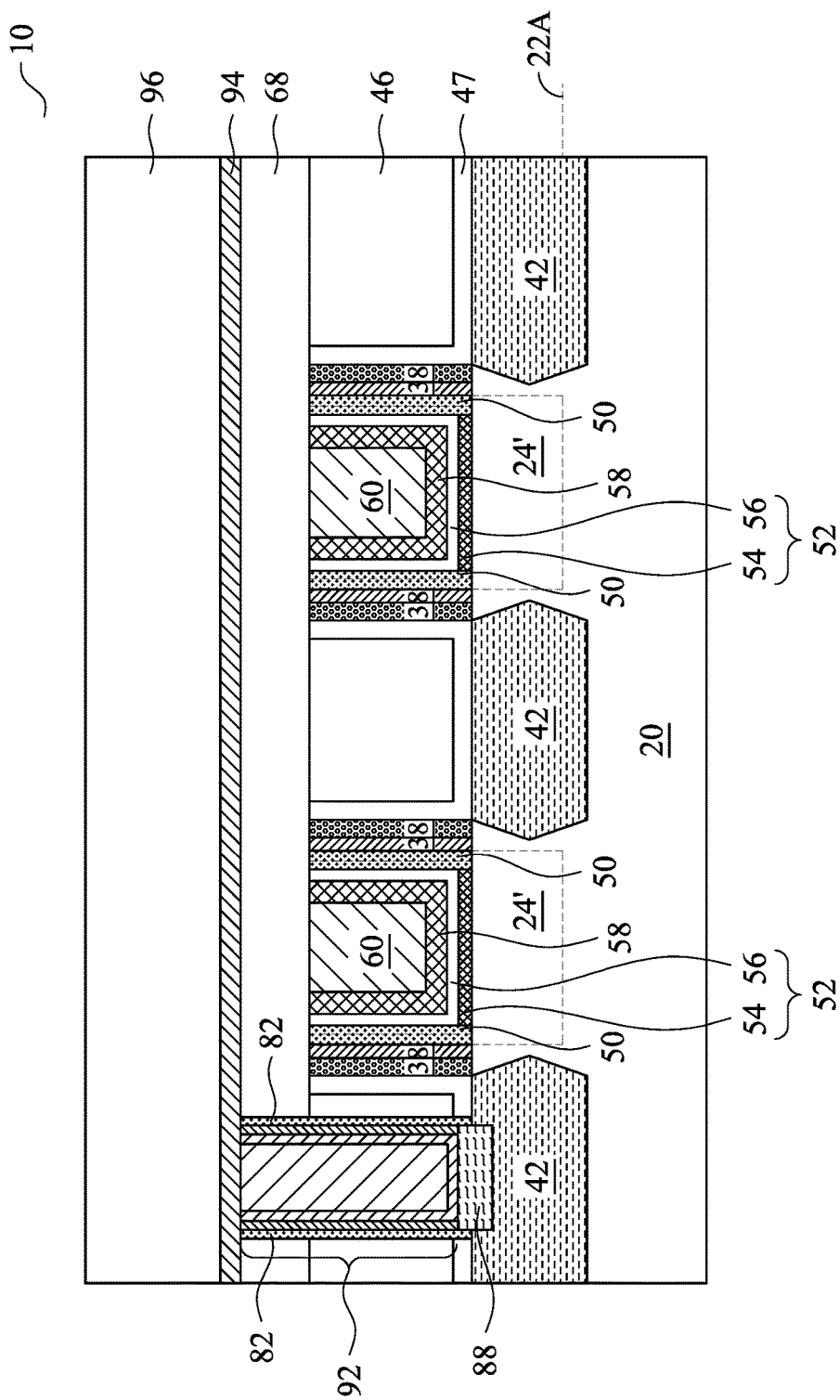

FIG. 19 illustrates the formation of etch stop layer 94 and Inter-Layer Dielectric (ILD) 96. The respective step is illustrated as step 218 in the process flow shown in FIG. 27. Etch stop layer 94 may be formed of silicon nitride, silicon carbide, silicon oxynitride, silicon carbo-nitride, or the like, and may be formed using a deposition method such as CVD. ILD 96 may include a material selected from PSG, BSG, BPSG, Fluorine-doped Silicon Glass (FSG), TEOS oxide, or PECVD oxide ($SiO_2$). Dielectric layer 96 may be formed using spin-on coating, FCVD, or the like, or formed using a deposition method such as PECVD or Low Pressure Chemical Vapor Deposition (LPCVD).

Figure 20:
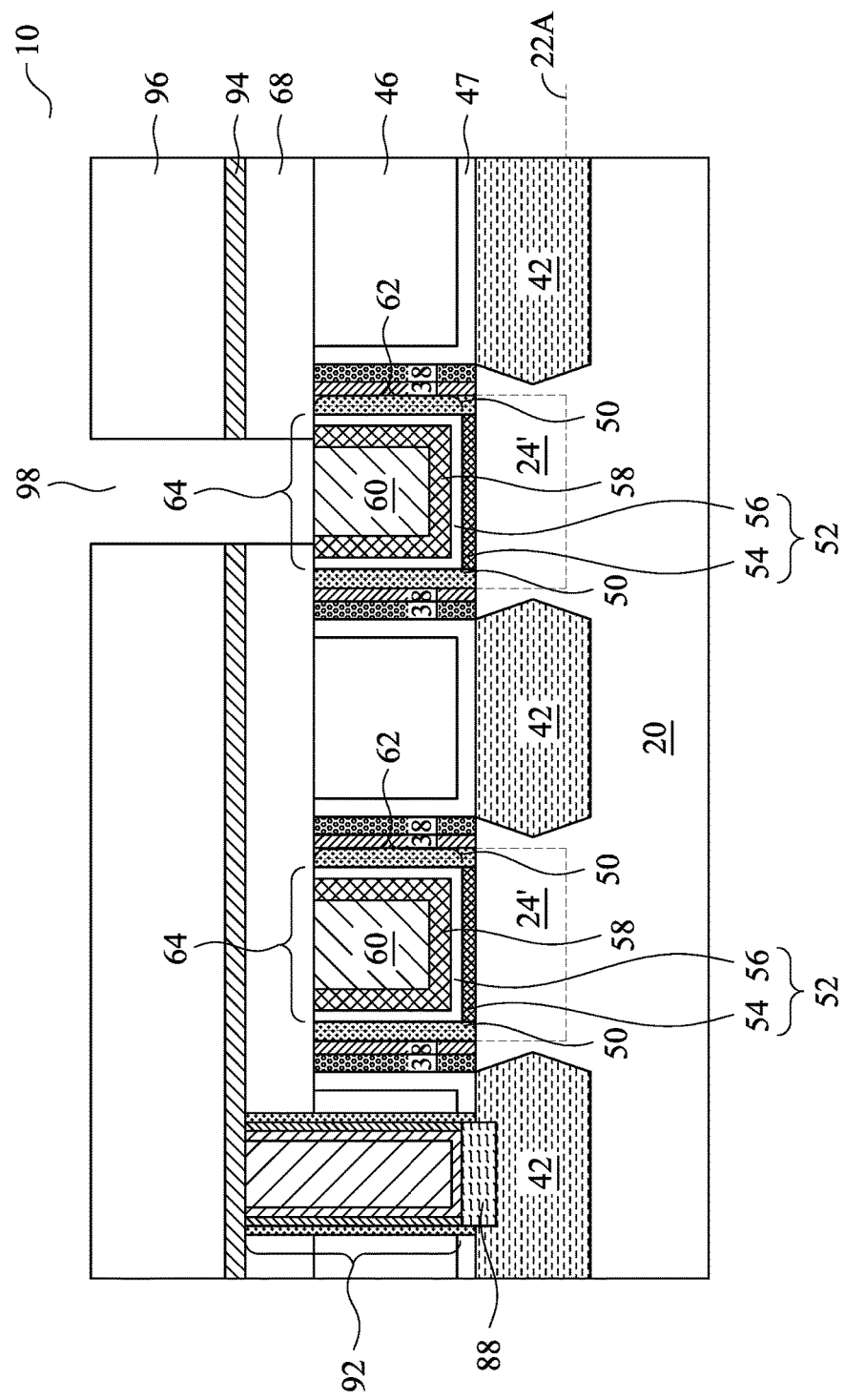

Referring to FIG. 20, ILD 96 and etch stop layer 94 are etched to form opening 98. In accordance with some embodiments of the present disclosure, opening 98 has a high aspect ratio (a ratio of height to width), which may be greater than about 4.0 or higher. The opening may be narrow, so that a first portion of the surface of metal gate electrode 62 is exposed, and a second portion of metal gate electrode 62 remains to be covered by ILD 68. In the operation of the resulting transistor, since metal gate electrode 62 is applied with a voltage, but does not have currents flowing through, the contact area between gate electrode 62 and the overlying gate contact plug may be small without significantly affecting the performance of the transistor. Accordingly, making opening 98 narrow is beneficial for reducing the size of the transistor without sacrificing electrical performance.

Figure 21:
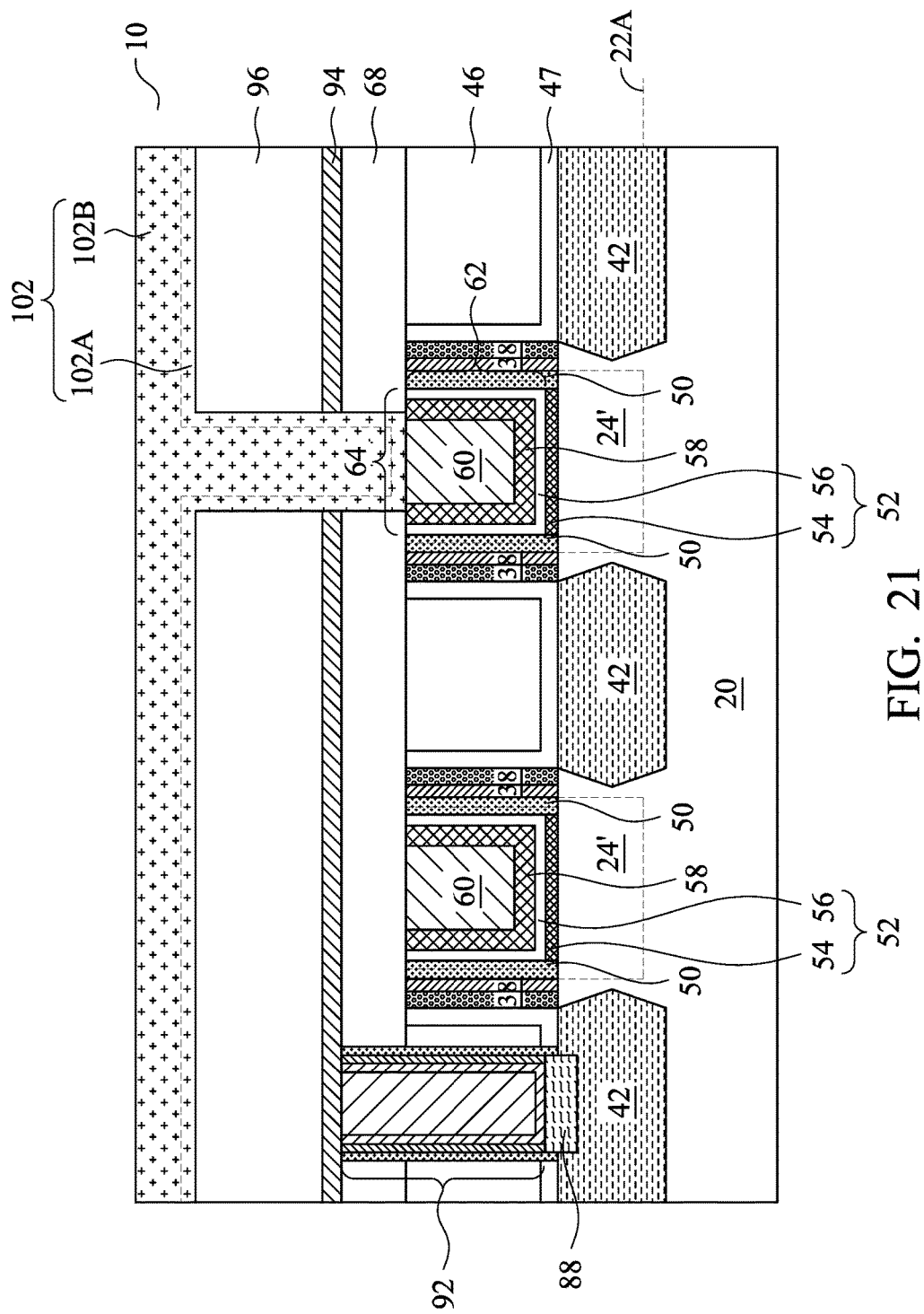

In a subsequent step, opening 98 is filled with a conductive material(s) 102, as shown in FIG. 21. Conductive material 102 has a good gap-filling capability, and hence is free from void therein. In accordance with some embodiments, conductive material 102 is formed of a metal nitride such as titanium nitride, and the formation method may include, for example, PVD. Although titanium nitride has a high resistivity (higher than metals), the high resistivity does not significantly affect the performance of the transistor since it is used for applying a voltage, not a current. In accordance with alternative embodiments, conductive material 102 is formed of other materials such as tungsten.

Conductive material 102 may be homogenous, and the entire conductive material 102 has the same composition, and may be formed of either homogenous titanium nitride or homogenous tungsten. In accordance with alternative embodiments, conductive material 102 has a composite structure including, for example, barrier layer 102A and metallic material 102B. Barrier layer 102A may be formed of titanium nitride, and metallic material 102B may be formed of tungsten, for example. Conductive material 102 is free from cobalt since the gap filling of cobalt is not good enough, and if cobalt is filled into opening 98 (FIG. 20), void may be generated therein due to the high aspect ratio of the respective opening.

Figure 22:
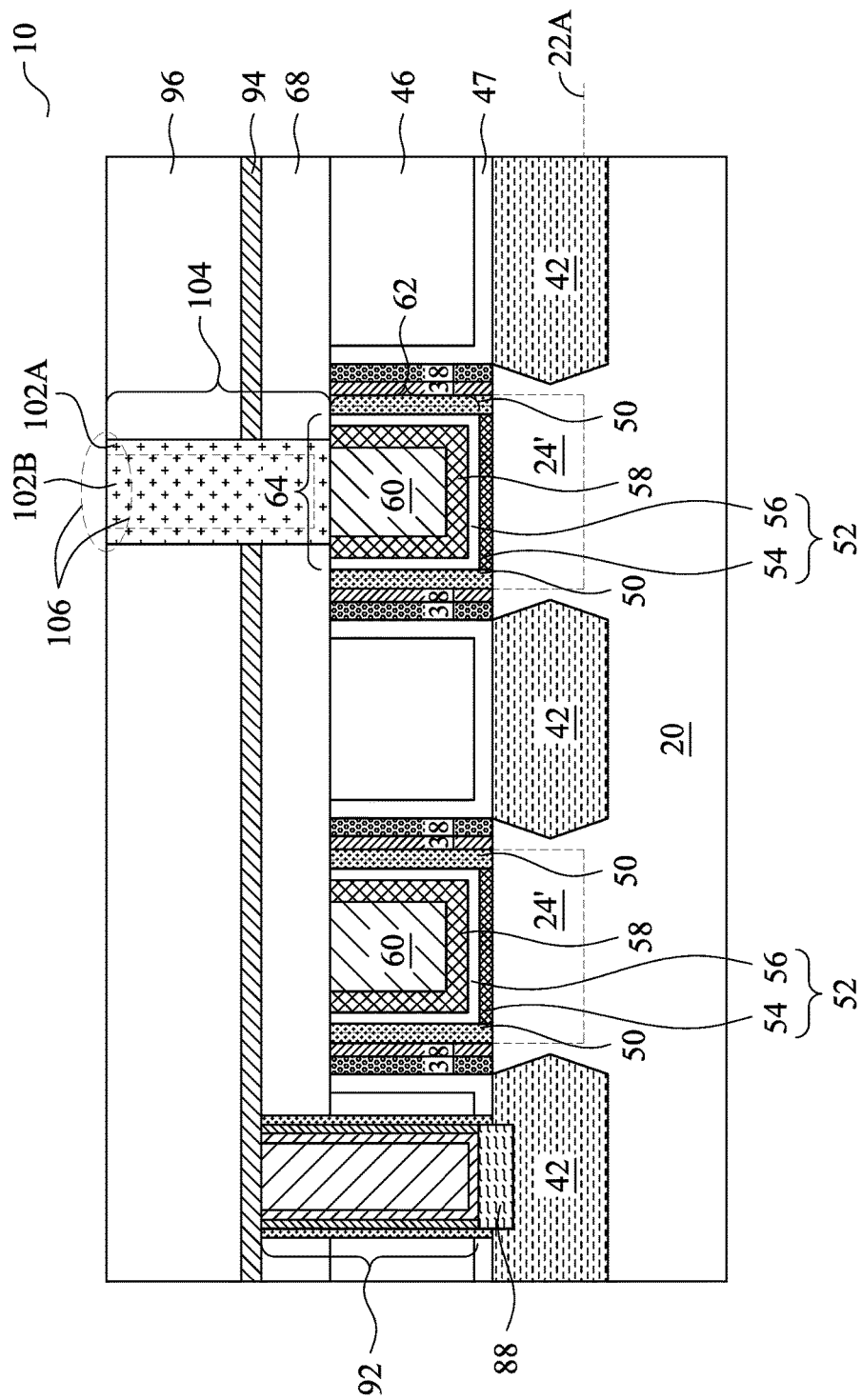

In accordance with some embodiments, a planarization step such as CMP or mechanical grinding is performed to remove excess conductive material 102, so that gate contact plug 104 is formed, as shown in FIG. 22. The respective step is illustrated as step 220 in the process flow shown in FIG. 27. The top surface of gate contact plug 104 is thus coplanar with the top surface of dielectric layer 96. In accordance with alternative embodiments, an etch-back process is performed to remove excess conductive material 102. The top surface of the resulting gate contact plug 104 may thus be higher than, level with, or lower than the top surface of ILD 96. Dashed lines 106 schematically illustrate the positions of the top surface of gate contact plug 104 when it is not level with the top surface of ILD 96.

Figure 23:
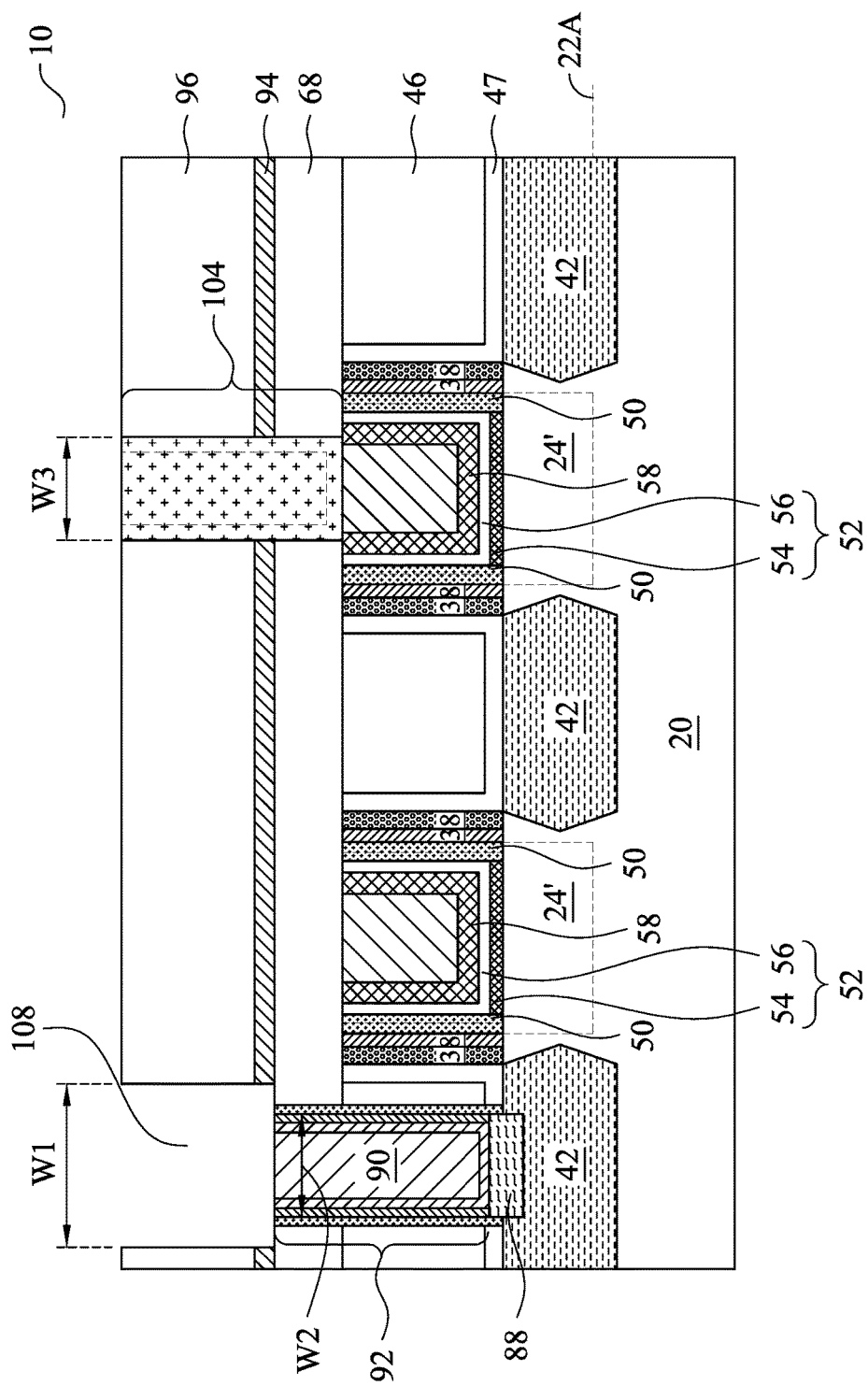

Referring to FIG. 23, ILD 96 and etch stop layer 94 are etched to form source/drain contact opening 108. The etching is performed by performing a first-stage etching, which is stopped on etch stop layer 94, and a second-stage etching, which stops on source/drain contact plug 92 and ILD 68. Opening 108 may have width W1 greater than the width W2 of the underlying source/drain contact plug 92. Accordingly, the entire top surface of source/drain contact plug 92 is used to contact the overlying source/drain contact plug 114 (FIG. 25), and hence the contact resistance between contact plugs 92 and 114 is minimized. Furthermore, width W1 is greater than width W3 of gate contact plug 104, and may be greater than about 1.2 times width W3. Ratio W1/W3 may also be between about 1.2 and 2.0.

Figure 24:
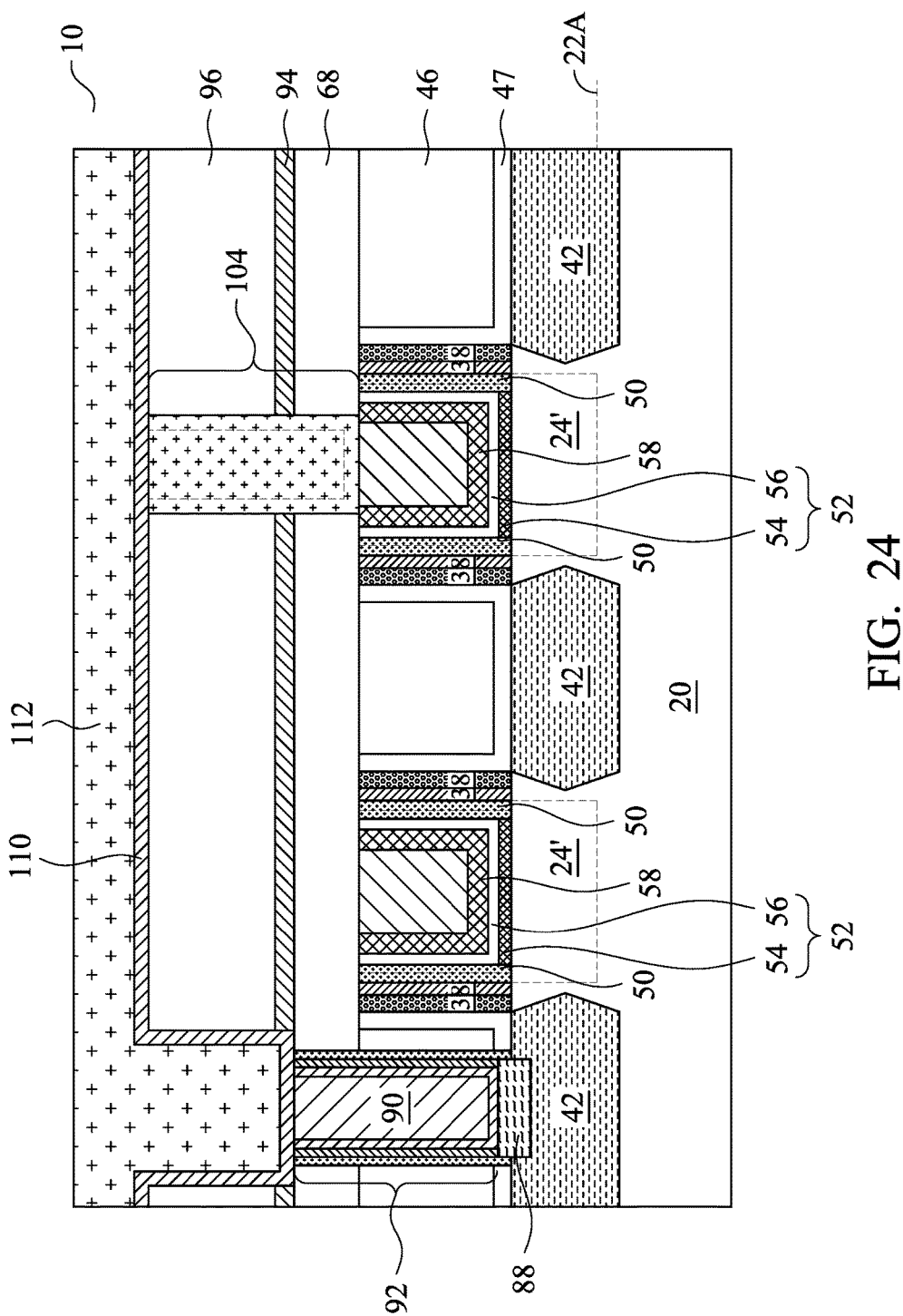

Next, a conductive material(s) is deposited into opening 108, as shown in FIG. 24. Conductive material 110/112 is different from that for forming contact plug 104. Since opening 108 has a low aspect ratio, the gap-filling of opening 108 is easy, and conductive material 110/112 does not have to have good gap-filling ability. However, the resistivity p2 of conductive material 110/112 is preferably low in order to conduct source/drain currents. Resistivity p2 is lower than resistivity p1 of gate contact plug 104.

Figure 25:
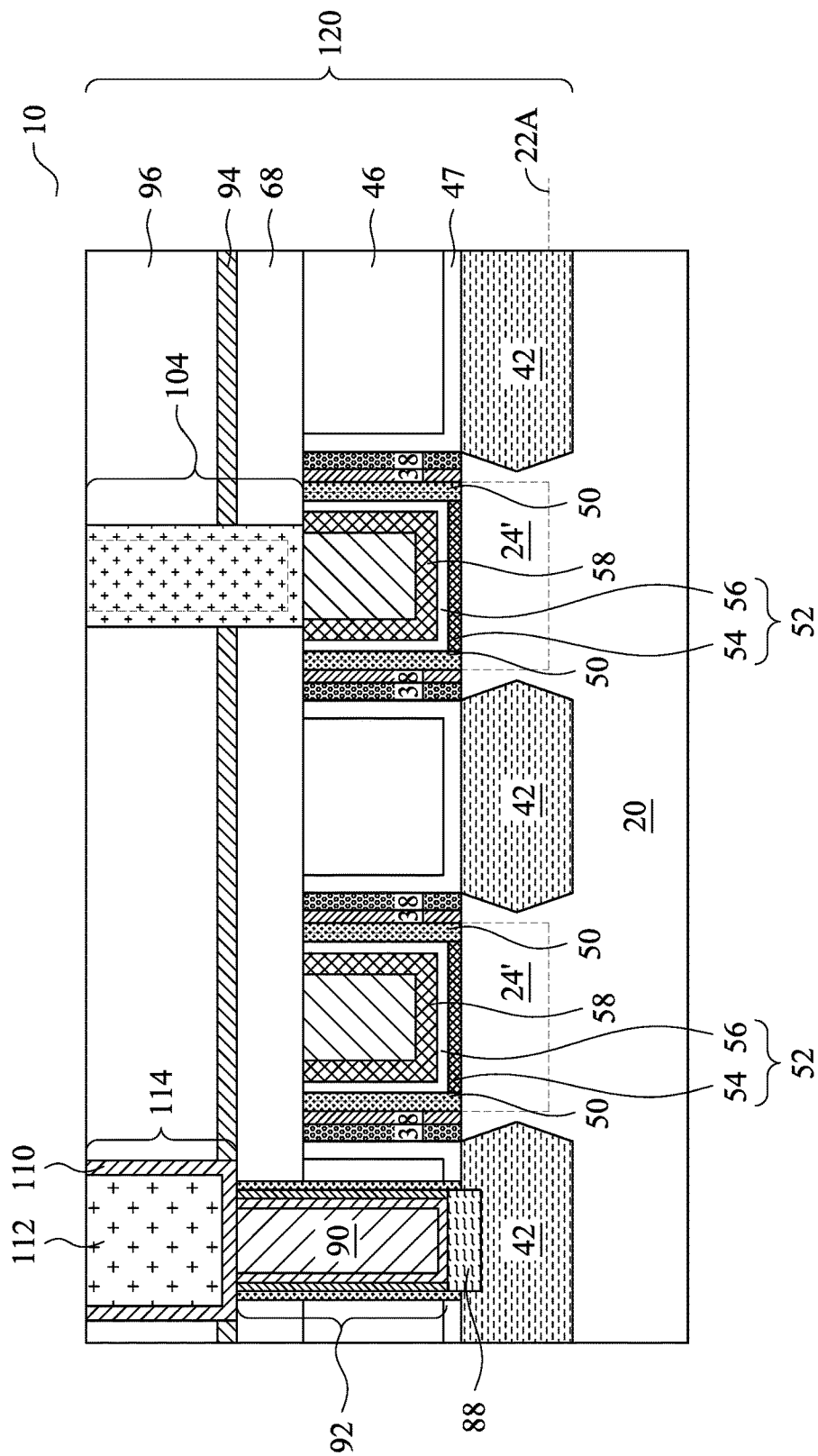

In accordance with some embodiments for forming conductive material 110/112, blanket barrier layer 110 is deposited, followed by the deposition of metal-containing material 112 over blanket barrier layer 110. Barrier layer 110 may be formed of a metal nitride such as titanium nitride or tantalum nitride. Metal-containing material 112 is formed of a material selected from tungsten, ruthenium, cobalt, copper, or alloys thereof. The formation methods of metal-containing material 112 may be selected from CVD, PVD, or the like. In accordance with some embodiments in which metal-containing material 112 comprises cobalt, conductive material 102 preferably does not include tungsten, and may be formed of homogenous titanium nitride. This is because in the subsequent planarization as shown in FIG. 25, gate contact plug 104 is also planarized, for example, using CMP. The slurry used for the CMP of cobalt may cause undesirable excess recession of the tungsten (if used in gate contact plug 104).

Next, referring to FIG. 25, a planarization step such as CMP or mechanical grinding is performed to remove excess conductive barrier layer 110 and metal-containing material 112, so that sourced/drain contact plug 114 is formed. The respective step is illustrated as step 222 in the process flow shown in FIG. 27. Throughout the description, source/drain contact plugs 92 and 114 are referred to as lower source/drain contact plug and upper source/drain contact plug, respectively. The formation of FinFET 120 is thus finished.

In accordance with some embodiments in which gate contact plug 104 (FIG. 22) is recessed as shown by dashed line 106, a portion of barrier layer 110 is filled into the recess of contact plug 104. Metal-containing material 112 may or may not be filled into the recess of contact plug 104, wherein the barrier layer 110 (with or without metal-containing material 112) are left as parts of FinFET 120.

Figure 26:
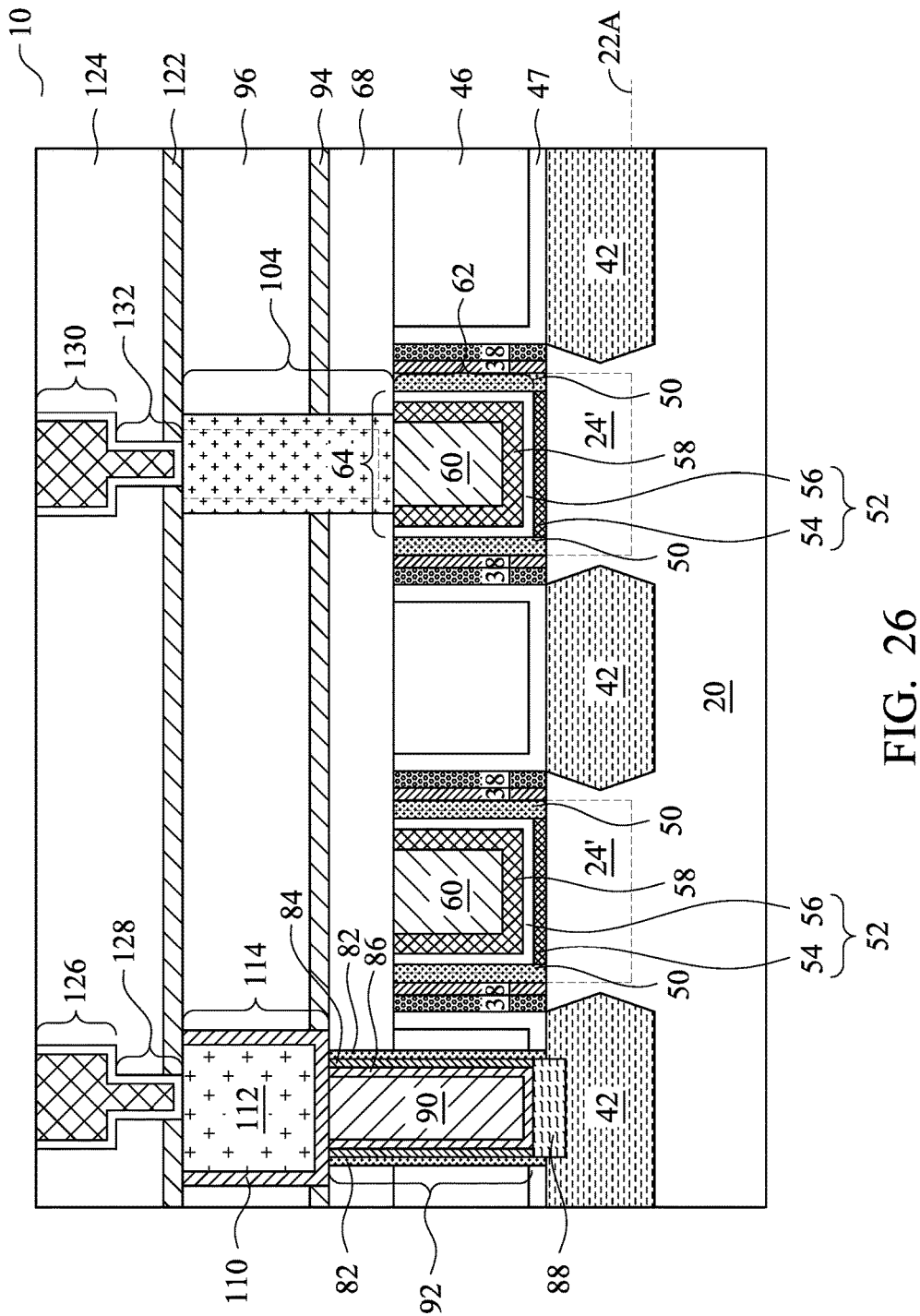
Figure 27:
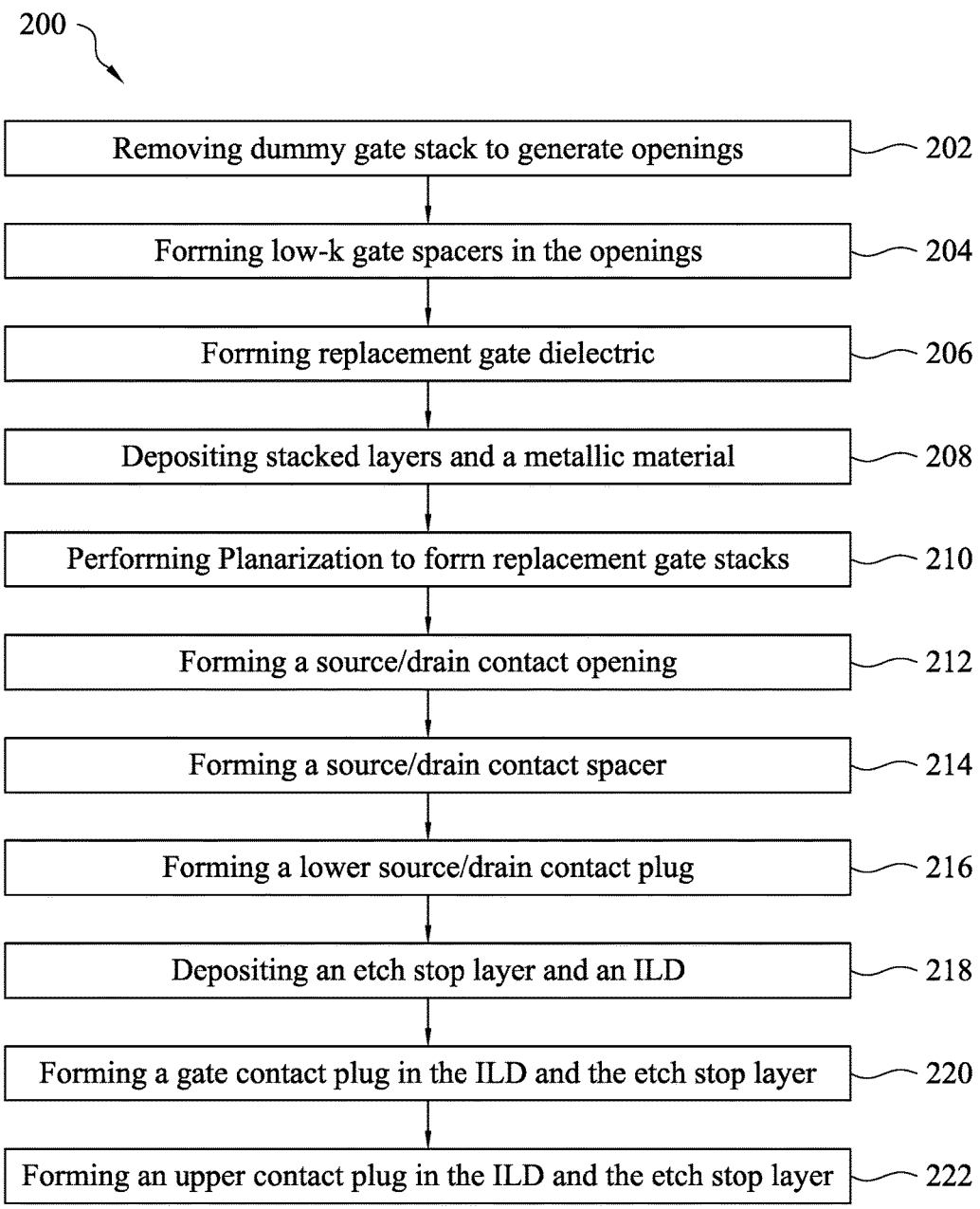
FIG. 27 illustrates a process flow for forming a transistor and contact plugs in accordance with some embodiments.

In subsequent steps, an interconnect structure is formed. For example, as shown in FIG. 26, etch stop layer 122 and Inter-Metal Dielectric (IMD) 124 are formed. IMD 124 may be formed of a low-k dielectric material. Metal lines 126 and 130 are formed in IMD 124, and are connected to source/drain contact plug 114 and gate contact plug 104, respectively, through vias 128 and 132, respectively.

The embodiments of the present disclosure have some advantageous features. Gate contact plug (104) may have a higher aspect ratio than source/drain contact plug (114), and hence it is difficult to perform the gap-fill of gate contact plug 92 without causing void. Accordingly, the gate contact plug is formed using a material(s) having good gap-filling ability. The resistivity of the gate contact plug, however, is not very restrictive since gate contact plug is used for applying voltages, not for conducting currents. Conversely, source/drain contact plugs prefer lower resistivity since they are used for conduct currents. However, the gap filling of the source/drain contact plugs is not very demanding since the source/drain contact plugs in accordance with the embodiments of the present disclosure have low aspect ratios. Accordingly, the materials with low resistivity values are selected for forming the source/drain contact plugs, while the gap-filling ability of the materials of source/drain contact plug is not very restrictive. In accordance with some embodiments of the present disclosure, the gate contact plug and the source/drain contact plugs are formed in different processes, and are formed using different materials, to meet their different requirements.

In accordance with some embodiments of the present disclosure, a method includes forming a transistor including forming a source/drain region on a side of a dummy gate stack, forming a first ILD covering the source/drain region, and replacing the dummy gate stack with a replacement gate stack. The method further includes forming a second ILD over the first ILD and the replacement gate stack, and forming a lower source/drain contact plug electrically coupling to the source/drain region. The lower source/drain contact plug penetrates through both the first ILD and the second ILD. A third ILD is formed over the second ILD. A gate contact plug is formed in the second ILD and the third ILD. An upper source/drain contact plug is formed overlapping and contacting the lower source/drain contact plug. The upper source/drain contact plug penetrates through the third ILD. The upper source/drain contact plug and the gate contact plug are formed of different materials.

In accordance with some embodiments of the present disclosure, a method includes forming a transistor having a gate stack and a source/drain region on a side of the gate stack, wherein the gate stack is in a first ILD, and forming a lower source/drain contact plug electrically coupling to the source/drain region. In a first process step, a gate contact plug is formed over and contacting the gate stack. In a second process step, an upper source/drain contact plug is formed overlapping and contacting the lower source/drain contact plug. An etch stop layer is formed over and contacting both the upper source/drain contact plug and the gate contact plug.

In accordance with some embodiments of the present disclosure, a device includes a first ILD, a gate stack in the first ILD, a second ILD over the first ILD, a source/drain region adjacent to the gate stack, and a lower source/drain contact plug over and electrically coupling to the source/drain region. The lower source/drain contact plug penetrates through both the first ILD and the second ILD. An upper source/drain contact plug is over and contacting the lower source/drain contact plug. A gate contact plug is over and contacting the gate stack. The upper source/drain contact plug and the gate contact plug are formed of different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a transistor comprising:
      forming a source/drain region on a side of a dummy gate stack;
      forming a first Inter-Layer Dielectric (ILD) covering the source/drain region; and
      replacing the dummy gate stack with a replacement gate stack;
   forming a second ILD over the first ILD and the replacement gate stack;
   forming a lower source/drain contact plug electrically coupling to the source/drain region, wherein the lower source/drain contact plug penetrates through both the first ILD and the second ILD;
   forming a third ILD over the second ILD;
   forming a gate contact plug in the second ILD and the third ILD; and
   forming an upper source/drain contact plug overlapping and contacting the lower source/drain contact plug, wherein the upper source/drain contact plug penetrates through the third ILD, and the upper source/drain contact plug and the gate contact plug are formed of different materials.

2. The method of claim 1, wherein the gate contact plug has an aspect ratio greater than an aspect ratio of the upper source/drain contact plug, and the gate contact plug has a higher resistivity than the upper source/drain contact plug.

3. The method of claim 1, wherein the upper source/drain contact plug and the gate contact plug are formed by separate processes.

4. The method of claim 1, wherein an entirety of the gate contact plug is formed by depositing a homogenous material, and the upper source/drain contact plug is formed by depositing a composite structure comprising a lower layer and an upper layer over the lower layer.

5. The method of claim 4, wherein the entirety of the gate contact plug is formed of a metal nitride.

6. The method of claim 5, wherein the entirety of the gate contact plug is formed of titanium nitride.

7. The method of claim 1, wherein the replacing the dummy gate stack with the replacement gate stack comprises:
   removing the dummy gate stack to form a trench in the first ILD;
   forming a gate spacer in the trench; and
   forming the replacement gate stack in the trench.

8. The method of claim 1, wherein the forming the lower source/drain contact plug comprises:
   etching the second ILD and the first ILD to form a source/drain contact opening;
   forming a contact spacer in the source/drain contact opening; and
   filling the source/drain contact opening with a metallic material to form the lower source/drain contact plug.

9. The method of claim 8, wherein the forming the contact spacer comprises forming a high-k dielectric spacer.

10. A method comprising:
    forming a transistor comprising a gate stack and a source/drain region on a side of the gate stack, wherein the gate stack is in a first Inter-Layer Dielectric (ILD);
    forming a lower source/drain contact plug electrically coupling to the source/drain region;
    forming a gate contact plug over and contacting the gate stack;
    forming an upper source/drain contact plug overlapping and contacting the lower source/drain contact plug, wherein the gate contact plug has an aspect ratio greater than an aspect ratio of the upper source/drain contact plug, and the gate contact plug has a higher resistivity than the upper source/drain contact plug; and
    forming an etch stop layer over and contacting both the upper source/drain contact plug and the gate contact plug.

11. The method of claim 10 further comprising:
    before the upper source/drain contact plug and the gate contact plug are formed, depositing a second ILD over the first ILD; and
    depositing a third ILD over the second ILD, wherein the lower source/drain contact plug penetrates through the first ILD and the second ILD, the gate contact plug penetrates through the second ILD and the third ILD, and the upper source/drain contact plug penetrates through the third ILD.

12. The method of claim 10, wherein an entirety of the gate contact plug is formed of a homogenous material, and the upper source/drain contact plug has a composite structure comprising a lower layer and an upper layer over the lower layer.

13. The method of claim 12, wherein the entirety of the gate contact plug is formed of a metal nitride.

14. The method of claim 12, wherein the entirety of the gate contact plug is formed of titanium nitride.

15. The method of claim 10, wherein the forming the lower source/drain contact plug comprises:
    etching the first ILD to form a source/drain contact opening;
    forming a contact spacer in the source/drain contact opening; and
    filling the source/drain contact opening with a metallic material.

16. The method of claim 15, wherein the forming the contact spacer comprises forming a high-k dielectric spacer.

17. A method comprising:
    forming a first Inter-Layer Dielectric (ILD) covering a source/drain region of a Fin Field Effect Transistor (FinFET);
    forming a second ILD over the first ILD and a gate stack of the FinFET;
    forming a lower source/drain contact plug electrically coupling to the source/drain region;
    forming a third ILD over the second ILD;
    forming a gate contact plug penetrating through the second ILD and the third ILD to contact the gate stack; and
    forming an upper source/drain contact plug overlapping and contacting the lower source/drain contact plug, wherein the upper source/drain contact plug penetrates through the third ILD, and the upper source/drain contact plug and the gate contact plug are formed in different processes, and are formed of different materials.

18. The method of claim 17, wherein the lower source/drain contact plug penetrates through both the first ILD and the second ILD.

19. The method of claim 17 further comprising forming an etch stop layer over and contacting both the upper source/drain contact plug and the gate contact plug.

20. The method of claim 17, wherein an entirety of the gate contact plug is formed by depositing a homogenous material, and the upper source/drain contact plug is formed by depositing a composite structure comprising a lower layer and an upper layer over the lower layer.

* * * * *